(12) United States Patent
Aoki et al.

(10) Patent No.: US 8,166,443 B2
(45) Date of Patent: Apr. 24, 2012

(54) METHOD OF SHIELD LINE PLACEMENT FOR SEMICONDUCTOR INTEGRATED CIRCUIT, DESIGN APPARATUS FOR SEMICONDUCTOR INTEGRATED CIRCUIT, AND DESIGN PROGRAM FOR SEMICONDUCTOR INTEGRATED CIRCUIT

(75) Inventors: Katsushi Aoki, Kawasaki (JP); Takahiro Toda, Kawasaki (JP); Junya Yamasaki, Kawasaki (JP); Shinichi Iida, Kawasaki (JP); Hiroki Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 696 days.

(21) Appl. No.: 12/216,377

(22) Filed: Jul. 2, 2008

(65) Prior Publication Data
US 2008/0276213 A1     Nov. 6, 2008

Related U.S. Application Data

(63) Continuation of application No. PCT/JP2006/300009, filed on Jan. 4, 2006.

(51) Int. Cl.
*G06F 17/50* (2006.01)
(52) U.S. Cl. ........................ 716/129; 716/126
(58) Field of Classification Search ........... 716/126–130
See application file for complete search history.

(56) References Cited

U.S. PATENT DOCUMENTS

| | | | |
|---|---|---|---|
| 6,510,545 B1* | 1/2003 | Yee et al. | 716/126 |
| 7,519,927 B1* | 4/2009 | Hryckowian et al. | 716/100 |
| 7,739,624 B2* | 6/2010 | McElvain et al. | 716/101 |
| 8,074,197 B2* | 12/2011 | McElvain et al. | 716/115 |
| 2004/0181766 A1* | 9/2004 | Fukui et al. | 716/14 |
| 2008/0184179 A1* | 7/2008 | Ito | 716/5 |

FOREIGN PATENT DOCUMENTS

| | | |
|---|---|---|
| JP | 5-12383 | 1/1993 |
| JP | 2000-259695 | 9/2000 |
| JP | 2001-184384 | 7/2001 |

OTHER PUBLICATIONS

International Search Report mailed Mar. 20, 2006 in connection with the International Application No. PCT/JP2006/300009.
David Busdeicker et al., "Allegro PCB Router Application Note Routing tandem differential pairs", Cadence Engineering, Retrieved from URL: http://www.cadence.co.in/community/allegro/Resources/resources_PCB/LR/appnote_tandemdiffpairs.pdf.
English Translation of Claims in Japanese Published Patent Application No. JP 2001-184384.
Japanese Office Action mailed Nov. 15, 2011 issued in corresponding Japanese Patent Application No. 2007-552841.

* cited by examiner

*Primary Examiner* — Jack Chiang
*Assistant Examiner* — Binh Tat
(74) *Attorney, Agent, or Firm* — Staas & Halsey LLP

(57) ABSTRACT

A semiconductor integrated circuit design apparatus includes: an association information creating unit which creates association information for associating wiring information of a signal line with wiring information of a shield line placed for the signal line; an association information storage unit which stores the thus created association information; and a shield wiring unit which, when the placement of the signal line is changed, changes in interlinking fashion with the changed placement the placement of the shield line that is associated with the signal line by the association information.

12 Claims, 24 Drawing Sheets

( WIRING DATA EDITING FOR WIRING LINE OTHER THAN SHIELD LINE )

↓

[ PERFORM PROCESSING FOR WIRING OTHER THAN SHIELD LINE ] — S21

↓

< VIA NEEDED? > — S22
— YES → ↓
— NO → ↓

[ PERFORM VIA PROCESSING FOR WIRING LINE OTHER THAN SHIELD LINE ] — S23

↓

( END )

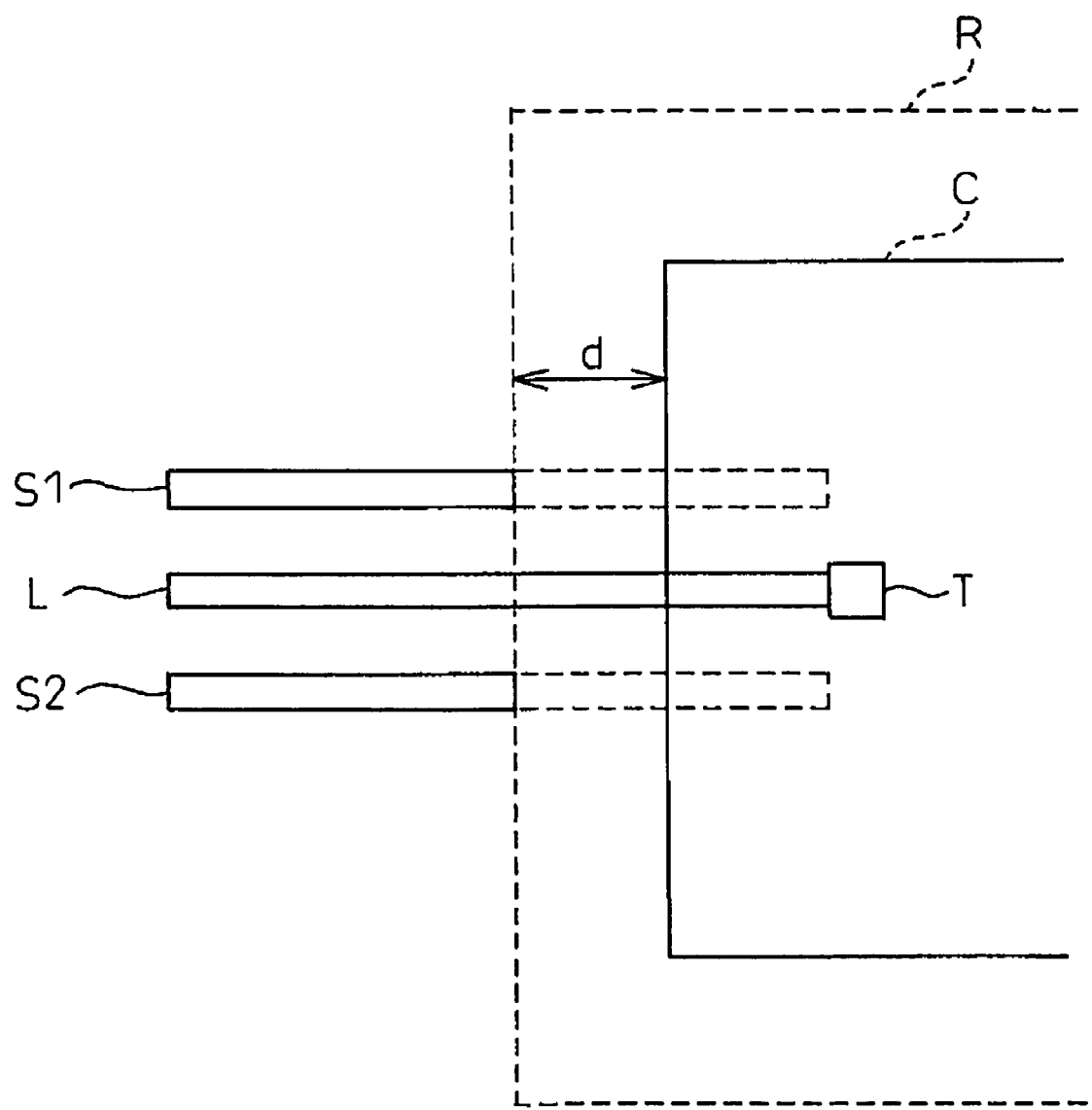

METHOD OF SHIELD LINE PLACEMENT FOR SEMICONDUCTOR INTEGRATED CIRCUIT, DESIGN APPARATUS FOR SEMICONDUCTOR INTEGRATED CIRCUIT, AND DESIGN PROGRAM FOR SEMICONDUCTOR INTEGRATED CIRCUIT

CROSS REFERENCE TO RELATED APPLICATION

The present application is a continuation application based on International application No. PCT/JP2006/300009, filed on Jan. 4, 2006.

BACKGROUND

1. Field

The present invention relates to a method of shield line placement for use in the design of a semiconductor integrated circuit, and to a design apparatus and design program for designing a semiconductor integrated circuit by automatically placing the shield lines.

2. Description of the Related Art

In recent years, as feature sizes for large-scale integrated circuits (LSIs) continue to decrease and packing density increase, crosstalk noise between wiring lines has come to present a non-negligible effect on the wiring lines. To prevent such crosstalk noise, the prior art has employed a circuit design that provides shielding by placing ground nets or power supply nets on both sides of signal nets (for example, clock nets) that can cause interference with other signal nets because of transmission of high-frequency signals or signal nets that need protection against interference from other signal nets (for example, refer to Japanese Unexamined Patent Publication No. 2000-259695).

As disclosed in Japanese Unexamined Patent Publication No. 2000-259695, shield line routing is partly automated in semiconductor integrated circuit design. However, in actual design work for high-end LSIs such as state-of-the-art, high-performance processors, the reality is that not only the routing of signal lines but also the routing of shield lines for shielding the signal lines is determined by humans, and the routing paths for these signal lines and shield lines are manually entered using a CAD application for semiconductor integrated circuit design. Accordingly, the prior art has had the following problems.

In the prior art CAD application for a semiconductor integrated circuit design, etc., signal lines and their associated shield lines have been handled as separate, independent routing data. Accordingly, if there arise a need, for design reasons, etc., to change the placement of the signal lines after the signal lines and the shield lines have once been routed, the routing of the shield lines has had to be changed manually so as to match the changed routing of the signal lines. In the prior art, therefore, there has been a concern that the operator may inadvertently forget to edit the shield lines that should be edited at the same time.

There has also been a concern that the operator may mistakenly edit shield lines that have no relevance to the edited signal lines. This problem has also occurred because the routing data of the signal lines and that of the shield lines have been handled as separate, independent data.

Especially, in the case of high-end LSIs, since fine adjustments need to be made after the routing is once done, the above problems associated with the editing performed after the routing add to the complexity of design work and pose serious difficulties.

In the prior art design flow, after determining the routing of the signal lines, the routing of their associated shield lines is determined, as described above. This has given a rise to the possibility that a signal line may be routed in such a manner that the associated shield line cannot be placed for it. If the associated shield line cannot be placed, proper shielding cannot be provided for the signal line; therefore, in this case, the routing of the signal line has to be redone from the beginning, which greatly affects the efficiency of the routing work.

If there occurs a change in design rule after the shield lines have been placed, and the need arises to apply the same change to a plurality of shield lines, each individual one of the plurality of shield lines has had to be corrected by hand, and hence the problem that the work efficiency is low.

An embodiment of the present invention has been devised in view of the above problems, and one of an object of the embodiment is to increase the efficiency of semiconductor integrated circuit design work by greatly saving the labor required for the routing of shield lines in the circuit design of a semiconductor integrated circuit in which the placement of signal lines and shield lines is determined by humans.

SUMMARY

One aspect of an embodiment creates association information for associating wiring information of a signal line with wiring information of a shield line placed for the signal line. Then, when the placement of the signal line is changed, the placement of the shield line associated with the signal line by the association information is changed in interlinking fashion with the changed signal line placement.

In one aspect of an embodiment, the wiring rule that defines the mode of placement of the shield line to be provided for the signal line in accordance with the mode of placement of the signal line is established in advance and stored. Then, the shield line is placed so as to match the placement of the signal line, by following the thus stored wiring rule.

BRIEF DESCRIPTION OF THE DRAWINGS

The above and other objects and features will become more apparent from the description of the preferred embodiments as set forth below with reference to the accompanying drawings, wherein:

FIG. 6 is a flowchart explaining a wiring data editing routine shown in FIG. 5 wiring lines other than shield lines;

FIG. 21 is a diagram explaining a process for prohibiting the placement of shield lines in a predetermined region;

DESCRIPTION OF THE PREFERRED EMBODIMENTS

Figure 1:
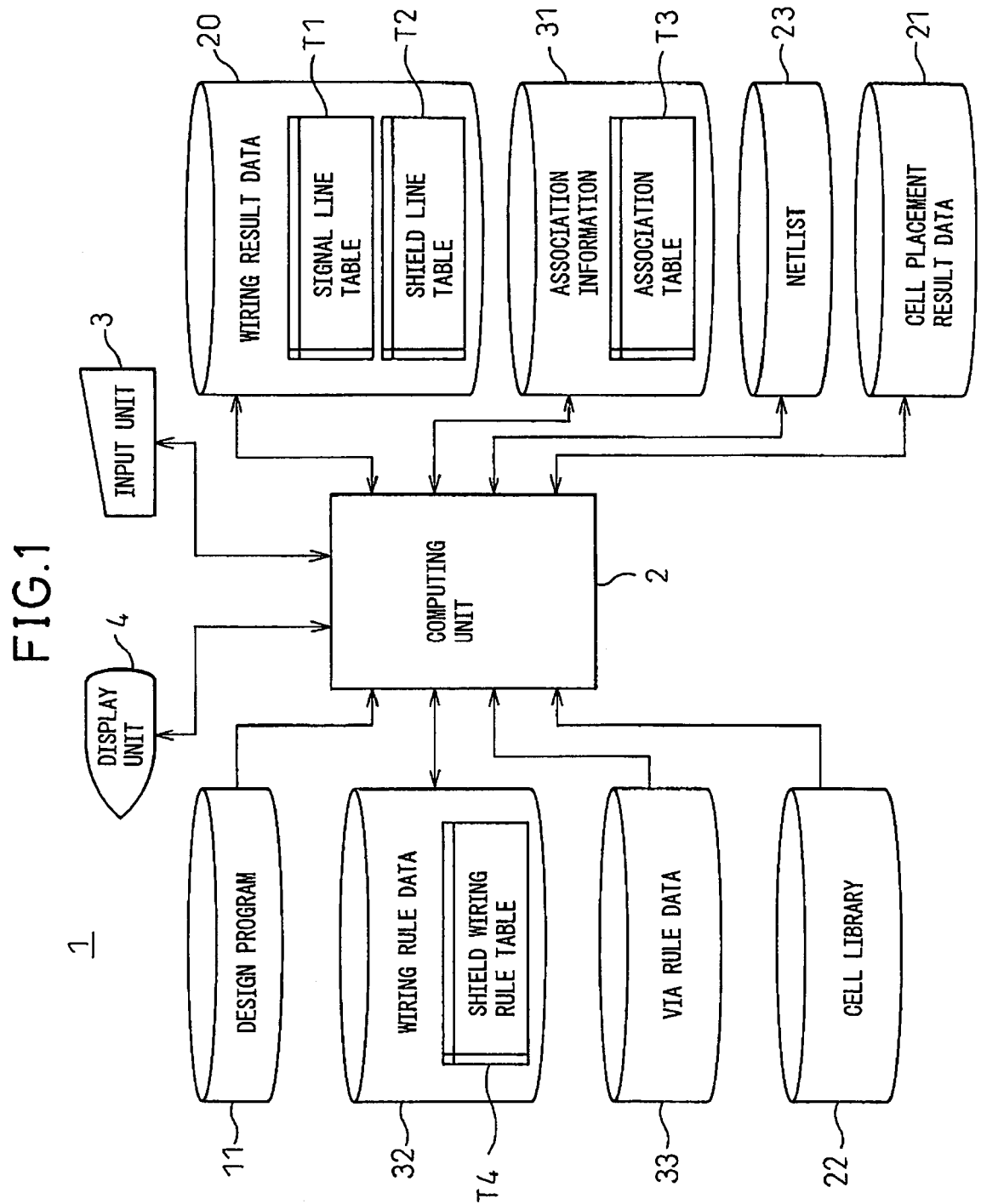
FIG. 1 is a diagram schematically showing the configuration of one embodiment of a semiconductor integrated circuit design apparatus.

The preferred embodiments of the semiconductor integrated circuit design apparatus will be described below with reference to the accompanying drawings. FIG. 1 is a diagram showing the configuration of one embodiment of the semiconductor integrated circuit design apparatus.

The design apparatus 1 comprises: a computing unit 2 which performs the design of a semiconductor integrated circuit by executing a semiconductor integrated circuit design program according to the present embodiment; an input unit 3 via which an operator enters information for specifying the positions, kinds, etc., of wiring lines and functional cells on the semiconductor integrated circuit into the computing unit 2; a display unit 4 which displays the result of placement of the cells, lines, etc.; and a design program storage unit 11 which stores the semiconductor integrated circuit design program according to the present embodiment. The computing unit 2 is implemented using a computer or the like, and the input unit 3 is implemented using a keyboard, mouse, digitizer, and other input interface.

The design program storage unit 11 is implemented using, for example, a hard drive device or a memory device. Alternatively, it may be implemented using a drive unit for reading a recording medium having the semiconductor integrated circuit design program recorded thereon, for example, a flexible disk, a CD-ROM disk, a DVD disk, a removable storage device, or the like. The recording media are not limited to the media described above, any recording medium can be used as long as it is capable of storing the program. Further, the semiconductor integrated circuit design program recorded on such a recording medium may be read out by a reading unit not shown, and loaded onto a hard disk drive or a memory device or the like provided within the design apparatus 1.

The design apparatus 1 further comprises a wiring result data storage unit 20 which stores wiring data as information about the conditions of placement (position, line width, etc.) of wiring lines, such as the signal lines entered via the input unit 3 and the shield lines automatically routed as will be described later, and the conditions of placement (position, size, shape, etc.) of vias for connecting between wiring layers. Of the wiring lines formed on the semiconductor integrated circuit, the wiring lines other than the shield lines will hereinafter be referred to as the "signal lines" if a distinction is necessary between the shield lines and the wiring lines other than the shield lines.

The wiring result data storage unit 20 stores the wiring data of the signal lines and the shield lines in table data form, for example, in the form of a signal line table T1 and a shield line table T2. The signal line table T1 stores, for example, an index assigned to each individual signal line to uniquely identify it, along with information necessary for signal line routing, such as start and end coordinates, line width, wiring layer, etc. for each signal line. Likewise, the shield line table T2 stores, for example, an index assigned to each individual shield line to uniquely identify it, along with information necessary for shield line routing, such as start and end coordinates, line width, wiring layer, etc., for each shield line.

The design apparatus 1 further includes a cell placement result data storage unit 21 which stores the conditions of placement (position, cell kind, etc.) of the functional cells entered via the input unit 3, a cell library storage unit 22 which stores functional cell library data, and a netlist storage unit 23 which stores a netlist as logical connection data showing the connections implemented by the wiring data stored in the wiring result data storage unit 20.

The design apparatus 1 further includes a wiring rule data storage unit 32 which stores wiring rule information necessary to generate or change the wiring data of the shield line to be provided for each signal line. The wiring rule information contains a set of rules each defining the mode of placement of the shield line to be provided for a given signal line when the given signal line is placed on the circuit, and this set of rules is defined in accordance with the design rule.

In the wiring rule data storage unit 32, the wiring rules defined for the various kinds of signal lines to be provided with shield lines are stored in table data form, for example, in the form of a shield wiring rule table T4. The shield wiring rule table T4 stores, for example, an index assigned to each wiring rule to uniquely identify it, along with information necessary to create shield line wiring data, such as the width of the shield line itself, the spacing to be provided between the shield line and its associated signal line, etc.

According to this rule, once the placement of the signal line to be shielded is determined on the circuit diagram, the shield line having the line width specified by the wiring rule can be placed along the signal line by maintaining therebetween the spacing specified by the wiring rule.

The design apparatus 1 further includes an association information storage unit 31 which stores association information for associating the signal line placed on the circuit with the shield line provided for the signal line. In the association information storage unit 31, data showing the correspondences between the signal lines and their associated shield lines are stored in table data form, for example, in the form of an association table T3. The association table T3 stores, for example, for each signal-line/shield-line correspondence, a pair of indexes consisting of an index assigned to the wiring data of the signal line and used as an index into the signal line table T1 and an index assigned to the wiring data of its associated shield line and used as an index into the shield line table T2.

Figure 2:
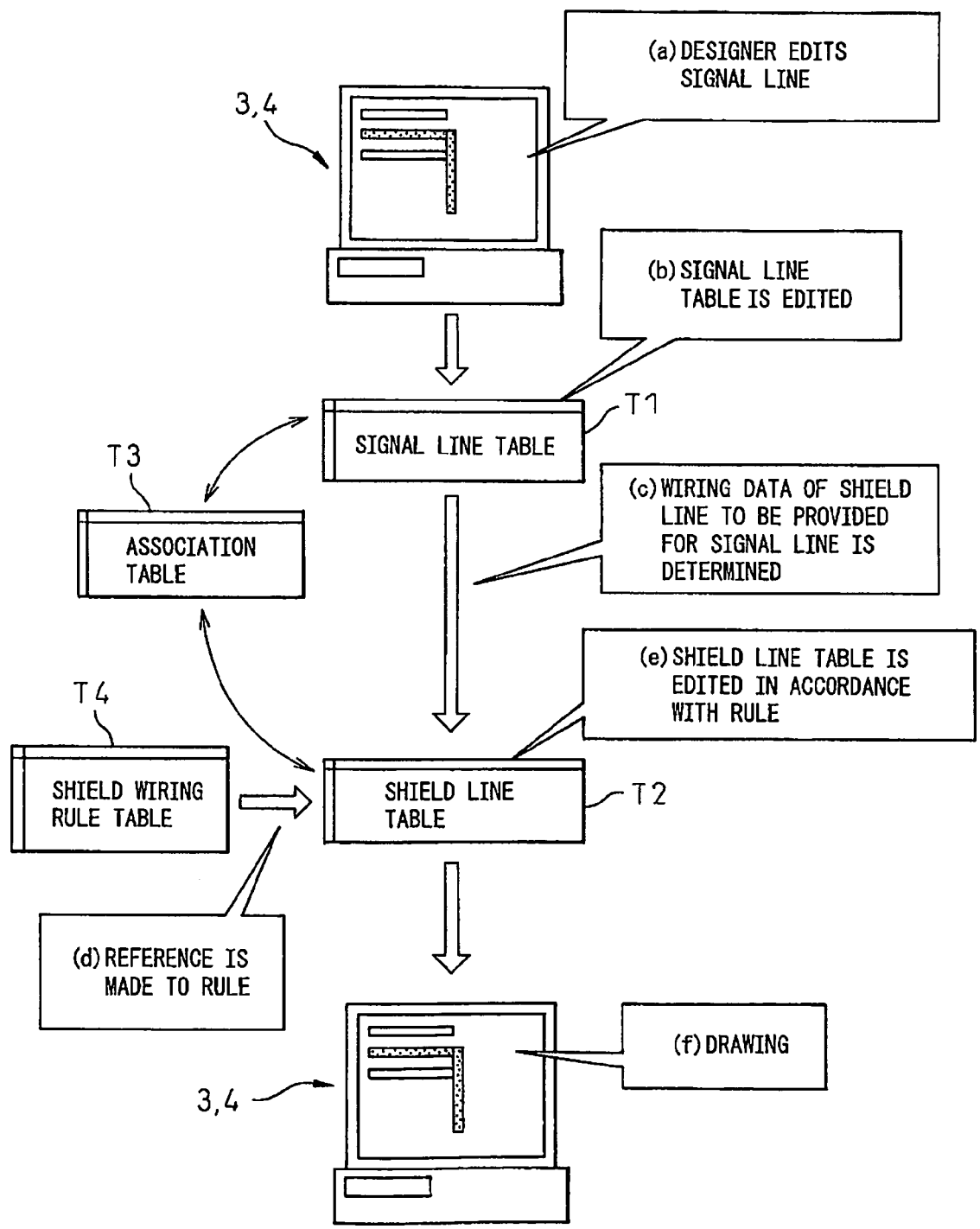
FIG. 2 is an explanatory diagram schematically showing a semiconductor integrated circuit design flow.

FIG. 2 is an explanatory diagram schematically showing a semiconductor integrated circuit design flow. First, (a) the designer edits the layout of signal lines via a GUI implemented by the input unit 3 and the display unit 4, (b) in accordance with the information entered via the GUI, the computing unit 2 edits the wiring data of the designed signal line, thus editing the signal line table T1, (c) the computing unit 2 determines the shield line to be provided for the thus edited signal line. In this case, the computing unit 2, for example, searches the association table T3 to retrieve the association information storing the index of the wiring data of the edited signal line, and acquires the index of the wiring data of the shield line from the retrieved association information, thus determining the wiring data of the shield line to be provided for that signal line, (d) further, the computing unit 2 retrieves from the shield wiring rule table T4 the shield line wiring rule to be applied to the edited signal line, (e) then, the computing unit 2 automatically edits the shield line table T2 in interlinking fashion with the editing of the signal line, thus editing the wiring data of the shield line to be provided for the signal line, to accomplish the automatic shield line placement. The editing of the shield line wiring data is performed in accordance with the rule read out of the shield wiring rule table T4.

If a change is made to the design rule, the shield line table T2 is automatically corrected, and the shield line wiring data that conforms to the changed design rule is generated.

Figure 3:
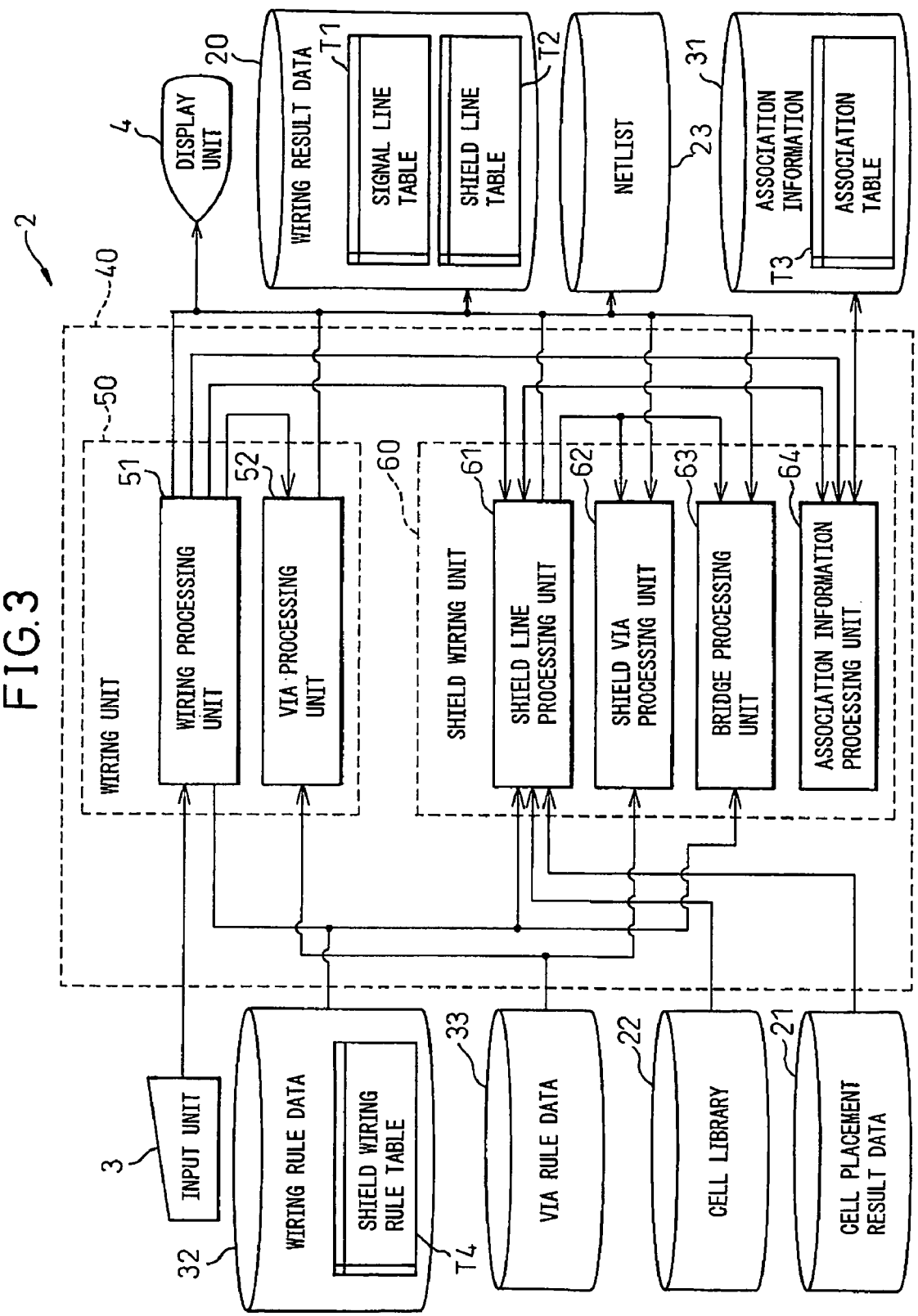
FIG. 3 is a functional block diagram of one embodiment of a computing unit.

FIG. 3 is a functional block diagram of the computing unit 2 according to the present embodiment. The functions of the computing unit 2 shown in FIG. 3 are implemented by the design program 40 stored in the design program storage unit 11. The computing unit 2 includes: a wiring unit 50 which generates or changes the wiring data concerning the signal lines and the logical connection data formed by the signal lines, based on the instruction information (placement instruction information) concerning the signal line placement that the operator entered via the input unit 3, and a shield wiring unit 60 which generates or changes the wiring data of the shield lines to be provided for the signal lines. The operation of the various component elements of the wiring unit 50 and the shield wiring unit 60 will be described below with reference to the operation flowcharts of the semiconductor integrated circuit design program shown in FIGS. 4 to 7.

Figure 4:
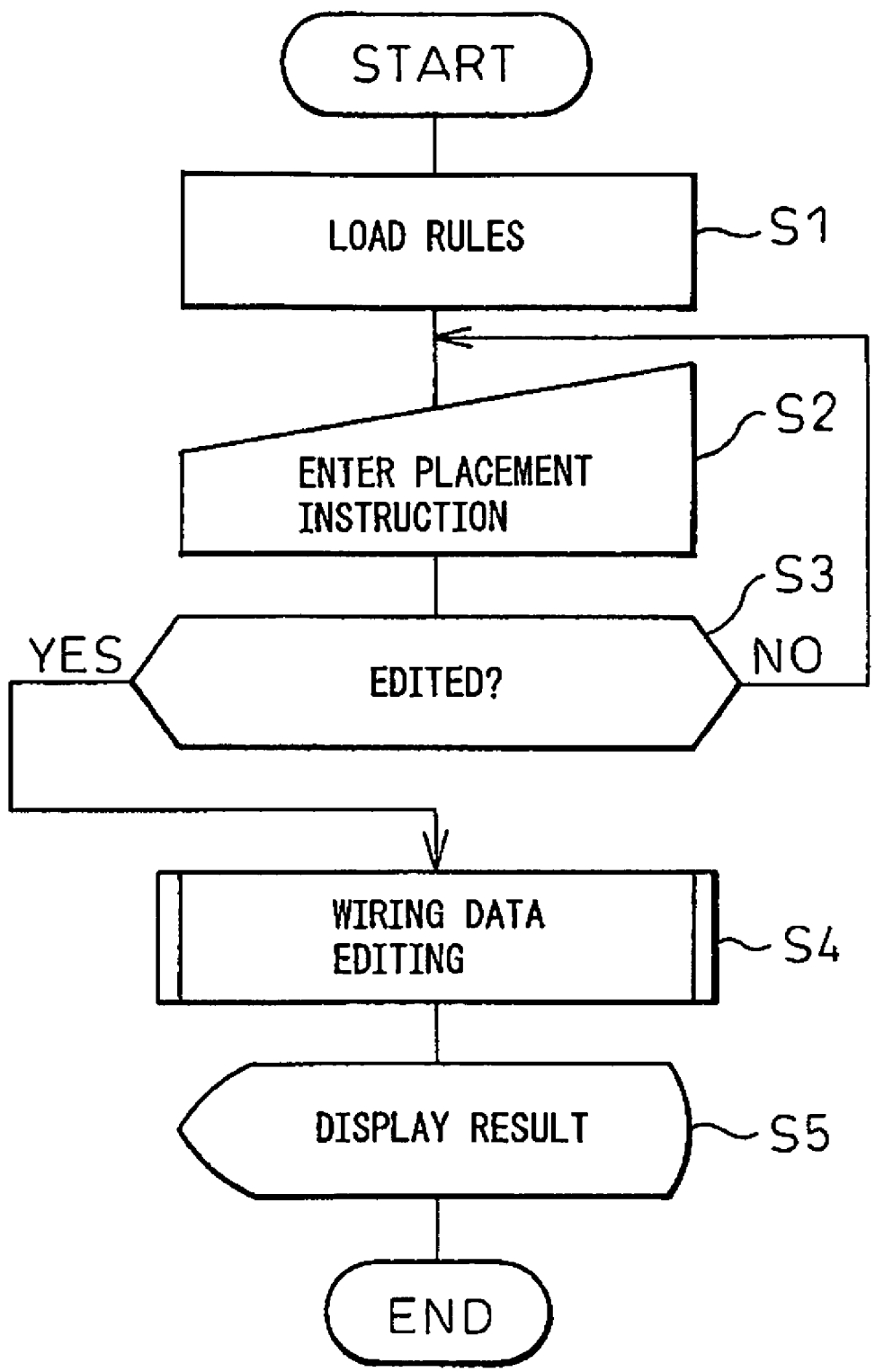
FIG. 4 is a general flowchart explaining the operation of a semiconductor integrated circuit design program shown in FIG. 3.

FIG. 4 is a flowchart for explaining the operation of the semiconductor integrated circuit design program 40 to be executed by the computing unit 2 shown in FIG. 3.

In step S1 shown in FIG. 4, the computing unit 2 loads into its internal memory (not shown) the wiring rule information contained in the shield wiring rule table T4 stored as an external file in the wiring rule data storage unit 32 which is implemented as an external storage area. The wiring rules concerning the shield lines may be provided in a more elaborate form to match the various modes of shield line placement, and some examples will be given later.

Further, the computing unit 2 loads into its internal memory the via rule information stored as an external file in the via rule data storage unit 33 which is implemented as an external storage area.

The via rule information contains a set of rules each defining the shape, size, etc. of a via to be formed on the circuit substrate when a given signal line and its associated shield line, when placed on the circuit diagram, extends across a plurality of layers, and the via rules also are defined in accordance with the design rule.

Such via rules may also be provided in a more elaborate form, and some examples will be given later.

In step S2, an instruction concerning the placement of a given signal line on the circuit diagram is entered via the input unit 3. This instruction is entered, for example, by the operator using a man-machine interface such as a keyboard, a mouse, or a digitizer, and more specifically by specifying the routing start point, end point, and intermediate points on the circuit diagram. In this case, when entering an instruction for adding a new signal line on the circuit, information indicating whether the signal line requires the provision of a shield line is also entered.

When entering an instruction for adding a new signal line, information is also entered that specifies, from among the rules stored in the wiring rule data storage unit 32 and the via rule data storage unit 33, the via rule to be applied to the via and the wiring rule to be applied to the shield line that should be provided for the signal line. The information for specifying the wiring rule to be applied to the shield line is, for example, the index assigned to that rule in the shield wiring rule table T4, and this information may sometimes be referred to as the "rule selection information" in the following description.

Further, when the edit instruction concerns copying or moving an existing signal line, or when the newly added signal line is connected to an existing signal line through a via, etc., the decision as to the requirement of a shield line or as to the selection of the via rule or shield line wiring rule to be applied may be made the same as that made for the existing signal line. In this case, the man-machine interface may be designed to terminate the step S2 without prompting the operator to enter the information indicating whether a shield line is required or not or the information for specifying the via rule or the wiring rule to be applied to the shield line.

In step S3, the computing unit 2 determines whether the instruction entered in step S2 involved adding, deleting, extending, shortening, moving, or copying a signal line. In the description hereinafter given, the processing such as addition, deletion, extension, shortening, moving, copying, etc. may be collectively referred to as "editing." The term "editing" is not restricted to the above enumerated processing, but can also include other processing. If it is determined in step S3 that the signal line has been edited, the computing unit 2 executes a wiring data editing routine (step S4).

In the wiring data editing routine S4, the wiring data stored in the signal line table T1 in the wiring result data storage unit 20 for the edited signal line is changed to reflect the result of the editing. Then, in interlinking fashion with this editing, the shield line wiring data stored in the shield line table T2 in the wiring result data storage unit 20 is edited, thus editing the shield line to be provided for the signal line.

After editing the signal line wiring data in accordance with the edit instruction entered in step S2, the computing unit 2 in step S5 displays the circuit diagram reflecting the result of the editing, after which the process is terminated. If it is determined in step S3 that the signal line has not been edited, the process of the computing unit 2 returns to step S2 to wait for an input from the input unit 3.

Figure 5:
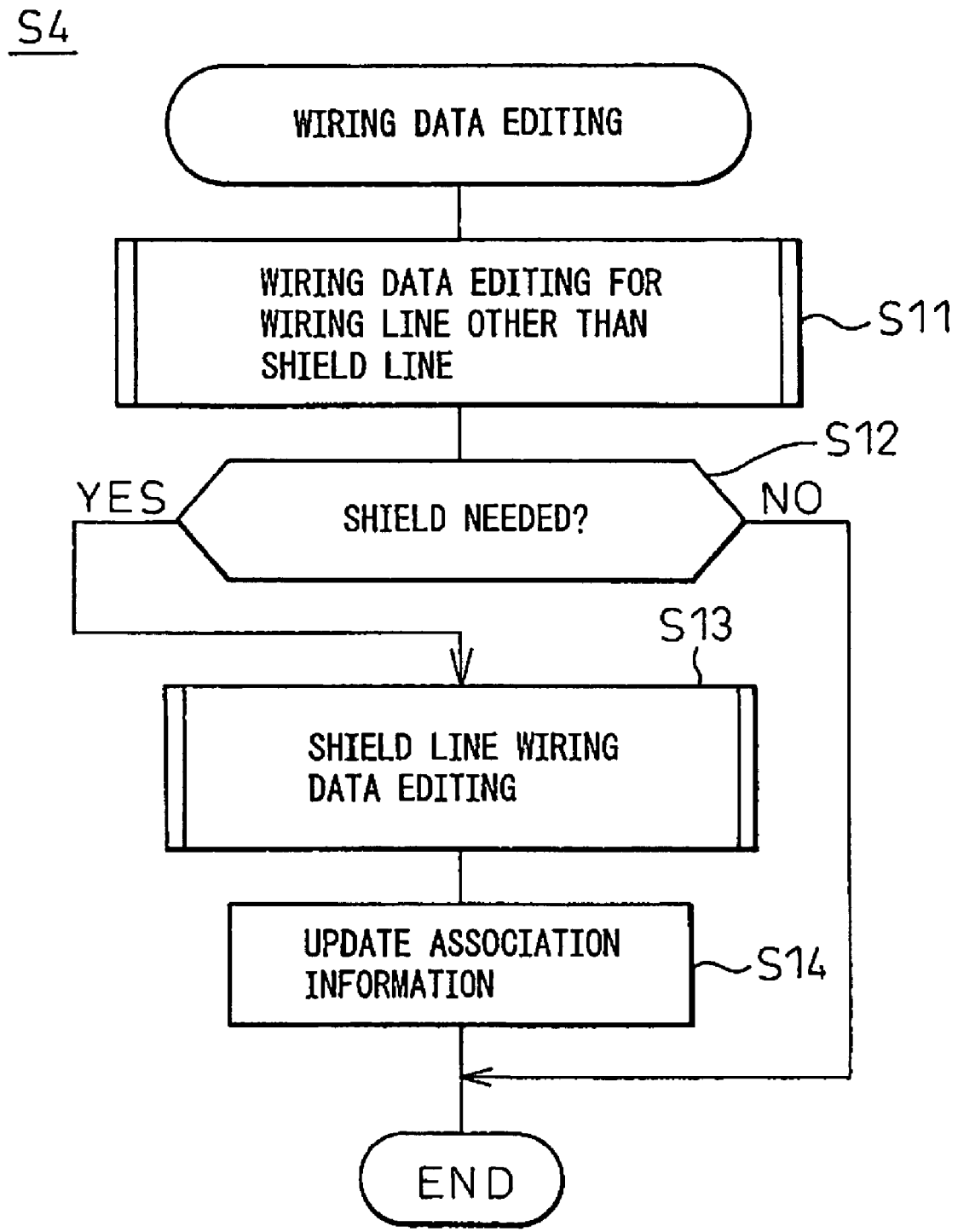
FIG. 5 is a flowchart explaining the processing of a wiring data editing routine shown in FIG. 4.

FIG. 5 is a flowchart explaining the processing of the wiring data editing routine S4 shown in FIG. 4.

In step S11, the wiring unit 50 edits the signal line table T1 in accordance with the signal line edit instruction entered in step S2, and thus edits the wiring data stored in the table for the specified signal line.

When adding wiring data concerning a new signal line, the wiring data is stored in the signal line table T1 by including therein the information entered in step S2 as to whether the signal line requires the provision of a shield line and the rule selection information entered for that signal line.

On the other hand, when the edit instruction concerns copying or moving an existing signal line, or when the newly added signal line is connected to an existing signal line through a via, etc., the information indicating whether a shield line is required or not and the rule selection information may be acquired from the wiring data of the existing signal line and may be included in the wiring data of the edited signal line. The signal line editing routine performed in step S11 will be described later with reference to FIG. 6.

In step S12 shown in FIG. 5, the wiring unit 50 determines whether the wiring data edited in step S11 requires the provision of a shield line or not, based on the presence or absence of the corresponding information. If the edited signal line does not require the provision of a shield line, the routine is terminated, and the process proceeds to step S5 shown in FIG. 4.

On the other hand, if the signal line whose wiring data has been edited in step S11 is one that requires the provision of a shield line, the wiring unit 50 supplies the index assigned to the wiring data of the signal line in the table T1 to the shield wiring unit 60, and thus notifies it that the wiring data of the shield line to be provided for the signal line should be edited. In response to this notification, the shield wiring unit 60 edits the shield line table T2 in step S13, thus editing the wiring data stored in the table for the shield line to be provided for the signal line. The shield line wiring data editing routine performed in step S13 will be described later with reference to FIG. 7.

In step S14, in accordance with the signal line wiring data edited in step S11 and the shield line wiring data edited in step S13, an association information processing unit 64 provided in the shield wiring unit 60 updates the association information for associating the wiring information of the signal line with the wiring information of the shield line, and stores it in the association table T3 maintained in the association information storage unit 20.

The association information is information that indicates the correspondence between the signal line and the shield line, for example, by storing a pair of indexes, i.e., the index assigned to the wiring data of the signal line as an index into the signal line table T1 in combination with the index assigned to the wiring data of its associated shield line as an index into the shield line table T2.

If the editing of the signal line wiring data in step S11, for example, concerns adding new wiring data (for example, the editing involves adding or copying a signal line), association information for associating the wiring data of the signal line with the wiring data of the shield line to be provided for the signal line is created and added in the association table T3.

On the other hand, if the editing of the signal line wiring data in step S11 or the editing of the shield line wiring data in step S13 is one that involves deleting the wiring data, the association information for the deleted wiring data is deleted from the association table T3.

After updating the association information, the process proceeds to step S5 shown in FIG. 4.

FIG. 6 is a flowchart for explaining the signal line wiring data editing routine S11 shown in FIG. 5.

In step S21, a wiring processing unit 51 provided in the wiring unit 50 generates or changes the wiring data concerning the specified signal line and the logical connection data formed by the signal line, based on the signal line placement instruction information entered via the input unit 3. Then, the generated or changed wiring data is stored in the signal line table T1, the logical connection data is stored in the netlist storage unit 23, and the result of the placement of the edited signal line is displayed based on the generated or changed wiring data on the display unit 4.

In step S22, a via processing unit 52 provided in the wiring unit 50 determines whether the signal line edited in step S21 is connected across a plurality of layers on the semiconductor integrated circuit. If it is determined that the signal line is one to be connected across a plurality of layers, then it is determined whether a via needs to be formed for the signal line. If it is determined that a via needs to be formed, then in step S23 the via processing unit 52 generates the wiring data for the via based on the preselected via rule, and stores it in the wiring result data storage unit 20. Then, the via processing unit 52 displays the via formed in accordance with the thus generated via wiring data on the display unit 4, after which the process proceeds to step S12. On the other hand, if it is determined that a via need not be formed, the process proceeds directly to step S12.

Figure 7:
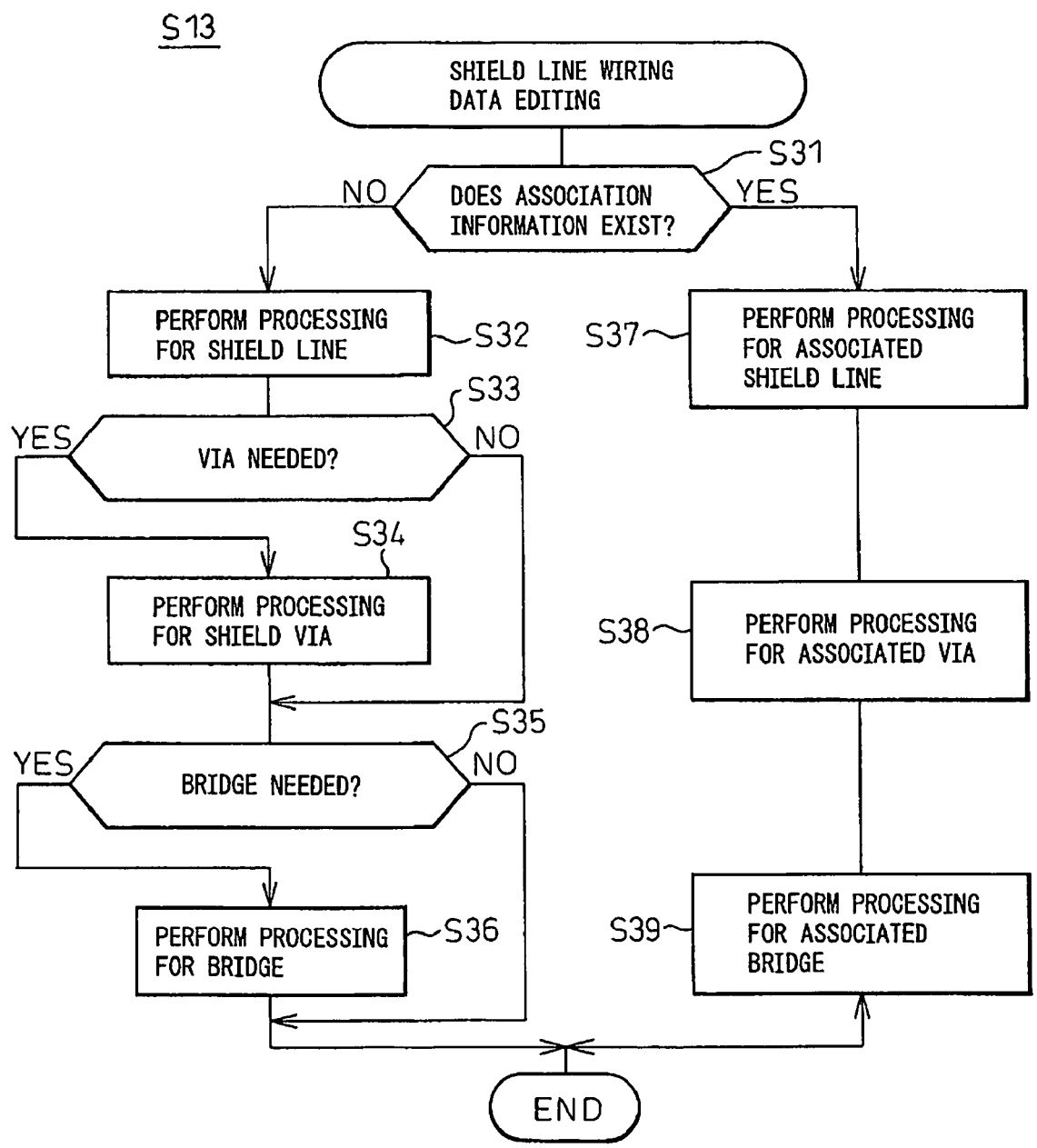
FIG. 7 is a flowchart explaining a shield line wiring data editing routine shown in FIG. 5.

FIG. 7 is a flowchart explaining the shield line wiring data editing routine S13 shown in FIG. 5.

Upon receiving in step S12 the notification from the wiring processing unit 51 in the wiring unit 50 that the wiring data of the shield line to be provided for the signal line should be edited, a shield line processing unit 61 determines in step S31 whether there is any association information associated with the wiring data of the signal line.

If there is no such association information, this means that the wiring data of the shield line to be provided for the signal line is not yet created. Then, in step S32, the shield line processing unit 61 creates the wiring data of the shield line to be provided for the signal line, so as to match the mode of placement of the signal line by following the wiring rule preselected in step S2, and stores the wiring data in the shield line table T2. Then, the result of the placement of the edited shield line is displayed based on the thus generated wiring data on the display unit 4.

In step S33, a shield via processing unit 62 provided in the shield wiring unit 60 determines whether the shield line created in step S32 is connected across a plurality of layers on the semiconductor integrated circuit and whether a via needs to be formed for the shield line. This determination is made based on the wiring data of the shield line.

If it is determined that a via needs to be formed for the shield line, then in step S34 the shield via processing unit 62 creates the wiring data concerning the shield via based on the preselected via rule, stores it in the wiring result data storage unit 20, and displays the thus formed via on the display unit 4. If there is no need to form a via, the shield via processing unit 62 transfers the process to step S35.

In step S35, a bridge processing unit 63 determines whether a bridge is needed for the created shield line. As will be described later with reference to FIG. 16, the bridge refers to a wiring line for short-circuiting a plurality of shield lines provided for a given signal line when such shield lines are formed in a different layer than the layer in which the signal line is formed, and such bridges are provided, one spaced apart from another by a prescribed distance along the wiring direction of the signal line or the shield lines. The mode of bridge placement (bridge wiring width, spacing, etc.) and the information as to whether the bridge is needed or not are also defined in the wiring rule as one mode of shield line placement, and the bridge processing unit 63 determines whether the bridge is needed or not, based on the preselected wiring rule.

If the bridge is needed, the bridge processing unit 63 in step S36 creates the wiring data concerning the bridge in accordance with the preselected wiring rule, stores it in the wiring result data storage unit 20, and displays the created bridge on the display unit 4. If the bridge is not needed, the process proceeds to step S14 shown in FIG. 5.

In this way, the shield wiring unit 60 creates the shield line wiring data based on the preset shield line wiring rule, etc. in interlinking fashion with the signal line placement entered by the operator.

According to the present embodiment, since the generation of the shield lines does not require any manual operation, the processing time from the editing of the signal line wiring data to the editing of the shield line wiring data can be greatly reduced. Furthermore, since the editing of the signal line wiring data, the editing of the shield line wiring data, and the processing for displaying the edited wiring lines on the screen can be performed almost simultaneously, the shield line to be provided for the signal line is displayed on the screen almost at the same time that the operator places the signal line, which serves to improve work efficiency.

Since the shield line can be placed at the same time that the signal line is placed, if the operator mistakenly places the signal line in such a manner that the shield line cannot be placed on the circuit, the operator can check on the screen that it is not possible to place the shield line, and the prior art problem can thus be avoided.

Turning back to step S31, if the association information for the edited signal line exists in the association table T3 in the association information storage unit 31, this means that the shield line is already placed for that signal line. Then, in step S37, the shield line processing unit 61 retrieves the association information created for the signal line from the association table T3, and determines the shield line associated with the signal line by retrieving based on the association information the wiring data of the shield line associated with the signal line.

For example, when the association information is information created by storing the index assigned to the wiring data of the signal line as an index into the signal line table T1 and the index assigned to the wiring data of its associated shield line as an index into the shield line table T2, the shield line processing unit 61 retrieves from the association table T3 the association information storing the index assigned to the signal line, and determines the shield line associated with the signal line by acquiring the index of the shield line from the retrieved association information.

As a result, if the placement of the signal line is changed after placing its associated shield line, the placement of the shield line provided for that signal line can be changed in interlinking fashion with the changed placement of the signal line, and a failure to edit the shield line, or erroneously editing, such as earlier described, can be prevented.

Further, when editing the wiring data of the shield line, the wiring data of the shield line is changed so as to match the mode of placement of the newly edited signal line by following the wiring rule specified by the rule selection information included in the wiring data of the signal line. Accordingly, if there occurs a change in the placement of the shield line as the placement of the signal line is changed, there is no need to reenter the shield line wiring rule, but the shield line can be edited based on the shield line wiring data changed in accordance with the wiring data of the changed signal line.

In step S38, the shield via processing unit 62 retrieves the association information created for the signal line from the association information storage unit 31, and determines the shield via for the shield line associated with the signal line. If the placement of the signal line is changed, the existing shield via wiring data is deleted, and after that, new wiring data is generated for the via needed for the shield line whose placement has been changed in step S37.

Further, in step S39, the bridge processing unit 63 retrieves the association information created for the signal line from the association information storage unit 31, and determines the bridge for the shield line associated with the signal line. If the placement of the signal line is changed, the existing bridge wiring data is deleted, and after that, new wiring data is generated for the bridge needed for the shield line whose placement has been changed in step S37.

Figure 8A:
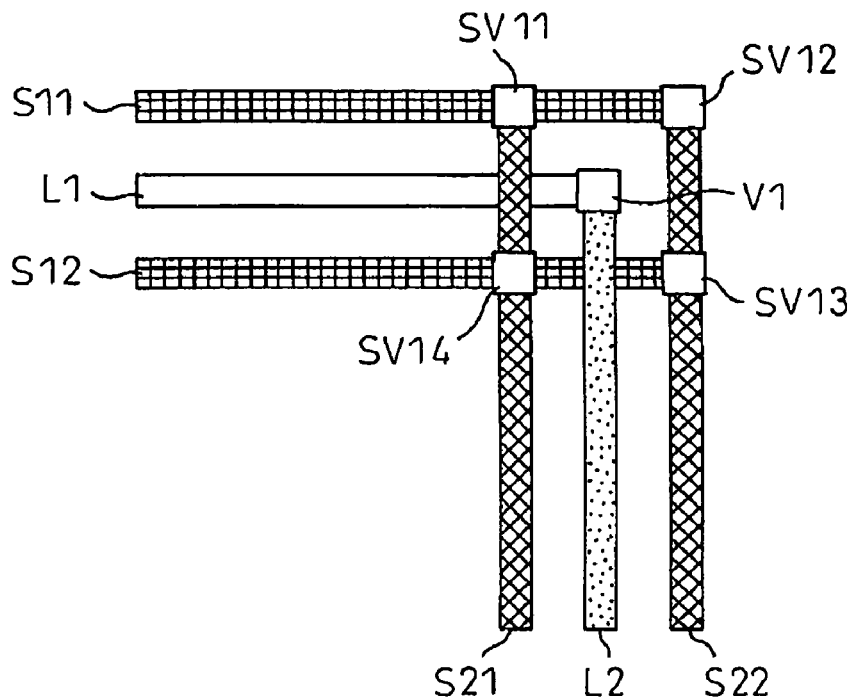
FIG. 8A is a diagram showing a wiring layout before a new signal line is added.
Figure 8B:
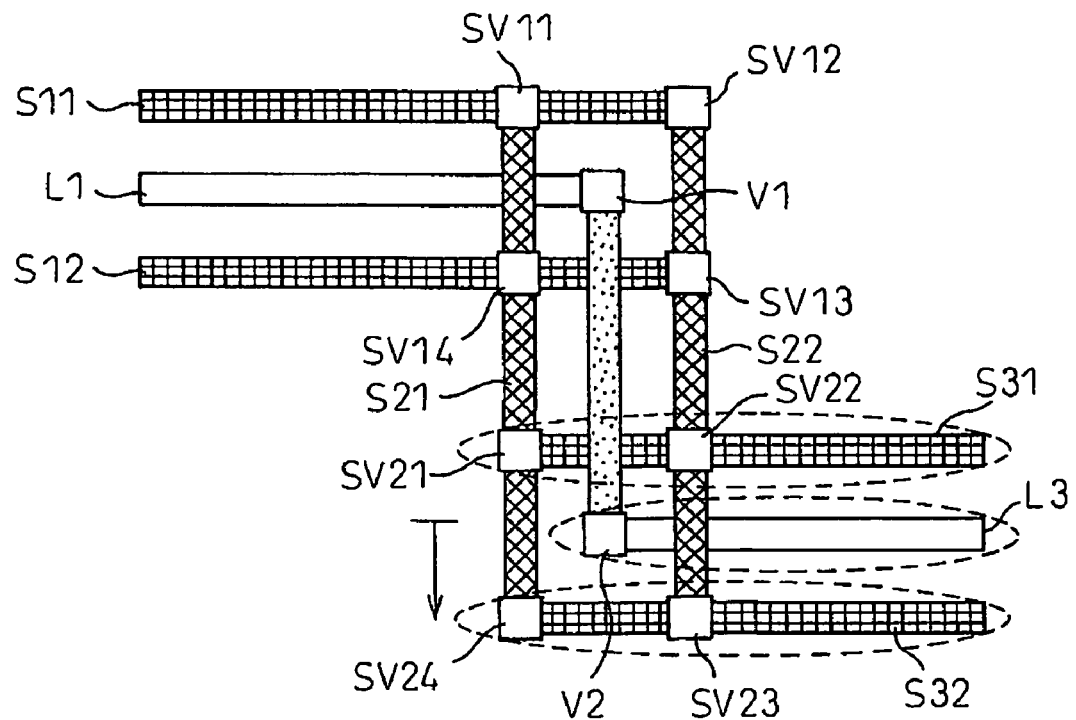
FIG. 8B is a diagram showing a wiring layout after the new signal line is added.

Next, a description will be given of how the shield line placement is performed by the semiconductor integrated circuit design apparatus 1 according to the present embodiment. FIGS. 8A and 8B are diagrams explaining the shield line placement when a new signal line is added: FIG. 8A is a diagram showing the wiring layout before the signal line is added, and FIG. 8B is a diagram showing the wiring layout after the signal line is added. In the following description, the step numbers shown in the flowcharts of FIGS. 4 to 7 are given where necessary.

In FIG. 8A, reference characters L1 and L2 indicate the signal lines, S11 and S12 indicate the shield lines provided for the signal line L1, and S21 and S22 indicate the shield lines provided for the signal line L2. Here, the signal lines L1 and L2 are formed in different wiring layers, the shield lines S11 and S12 are formed in the same wiring layer as the signal line L1, and the shield lines S21 and S22 are formed in the same wiring layer as the signal line L2. Further, L1 and L2 are connected by a via V1, the shield lines S11 and S21 are connected by a via SV11, the shield lines S11 and S22 are connected by a via SV12, the shield lines S12 and S21 are connected by a via SV14, and the shield lines S12 and S22 are connected by a via SV13.

The same reference characters L1, L2, S11 to S22, and SV11 to SV14 are used throughout the drawings given hereinafter in FIGS. 9A, 9B, 10A, 10B, 11A, 11B, 12A, 12B, 13A, 13B, 14A, and 14B.

In FIG. 8B, consider the case in which editing is done to add a signal line L3 for connection to the existing signal line L2 provided with shielding. When the operator performs editing to add the signal line L3 (S2), the wiring processing unit 51 provided in the wiring unit 50 creates the wiring data of the signal line L3 and stores it in the signal line table T1 in the wiring result data storage unit 20 (S4, S11, S21).

Then, the via processing unit 52 creates the via wiring data of the via V2 and stores it in the wiring result data storage unit 20 (S22, S23).

As earlier described with reference to FIG. 5, when the wiring processing unit 51 creates the wiring data of the signal line L3 (S11), the information as to whether shielding is needed or not and the rule selection information can be copied for use from the wiring data of the existing signal line L2 to which the signal line L3 connects.

Accordingly, when subsequently determining whether shielding is needed for the signal line L3 (S12), since the information concerning the shielding for the signal line L3 is the same as that for the signal line L2 provided with shielding, it is determined in step S12 that shielding is needed.

Further, to determine whether there is any existing shield line for the signal line L3, it is checked whether there is any shield line wiring data associated with the wiring data of the signal line L3 (S13, S31). In the illustrated example, since the editing is done to add the signal line L3, it is determined that there is no associated shield line.

Then, the shield line processing unit 61 in the shield wiring unit 60 automatically generates in accordance with the preloaded wiring rule (S1) the wiring data of the shield lines S31 and S32 to be provided for the signal line L3 (S32), and stores the generated wiring data in the shield line table T2. At the same time, the shield line processing unit 61 edits the wiring data of the existing shield lines S21 and S22 in accordance with the wiring rule, and extends them so that the shield lines S21 and S22 can be connected to the shield lines S31 and S32.

On the other hand, the shield via processing unit 62 generates the wiring data concerning the vias SV21, SV22, SV24, and SV23 for connecting the shield lines S21 and S31, S21 and S32, S22 and S31, and S22 and S32, respectively (S34), and stores the generated wiring data in the wiring result data storage unit 20.

Figure 9A:
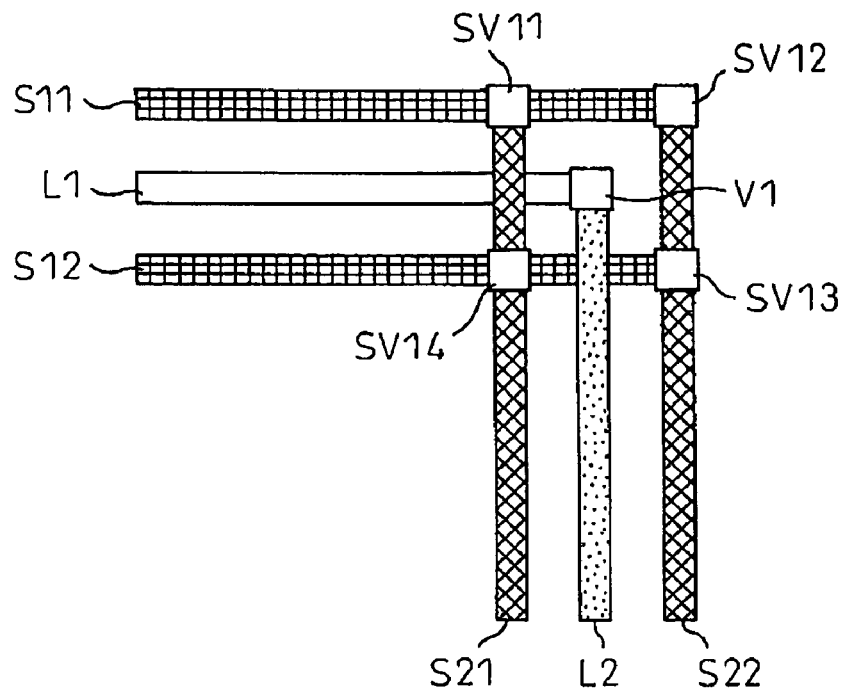
FIG. 9A is a diagram showing a wiring layout before a signal line is deleted.
Figure 9B:
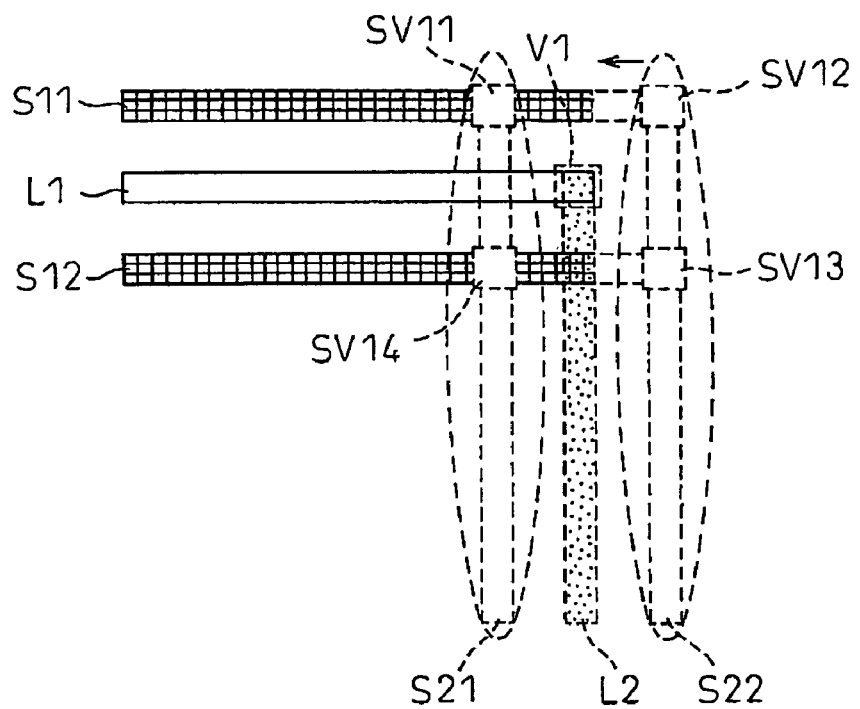
FIG. 9B is a diagram showing a wiring layout after the signal line is deleted.

FIGS. 9A and 9B are diagrams explaining the shield line placement when a signal line is deleted: FIG. 9A is a diagram showing the wiring layout before the signal line is deleted, and FIG. 9B is a diagram showing the wiring layout after the signal line is deleted.

When editing is done to delete the signal line L2 provided with shield lines (S2), the wiring processing unit 51 deletes the wiring data of the signal line L2 from the signal line table T1 (S4, S11, S21). Then, the via processing unit 52 deletes the wiring data for the via V1 (S23). In this case, at least the information necessary for the deletion of the wiring data may be taken from the wiring data of the signal line L2 and temporarily stored in the internal memory (not shown) of the computing unit 2 until the deletion of the shield line wiring data for the signal line L2 subsequently performed is completed.

A determination is then made as to whether shielding is needed for the signal line L2 (S12), and a determination is also made as to the presence or absence of the shield line wiring data associated with the wiring data of the signal line L2 (S13, S31).

Since the signal line L2 was provided with the shield lines S21 and S22, the shield line processing unit 61 deletes the wiring data of the shield lines S21 and S22 associated with the wiring data of the signal line L2 from the shield line table T2 (S37).

At the same time, the shield line processing unit 61 edits the wiring data of the shield lines S11 and S12 in accordance with the wiring rule, and shortens them so that they are just sufficient to shield the signal line L1.

Further, the shield via processing unit 62 deletes from the wiring result data storage unit 20 the wiring data concerning the vias SV11, SV12, SV14, and SV13 provided for the shield lines S21 and S22 (S38).

Figure 10A:
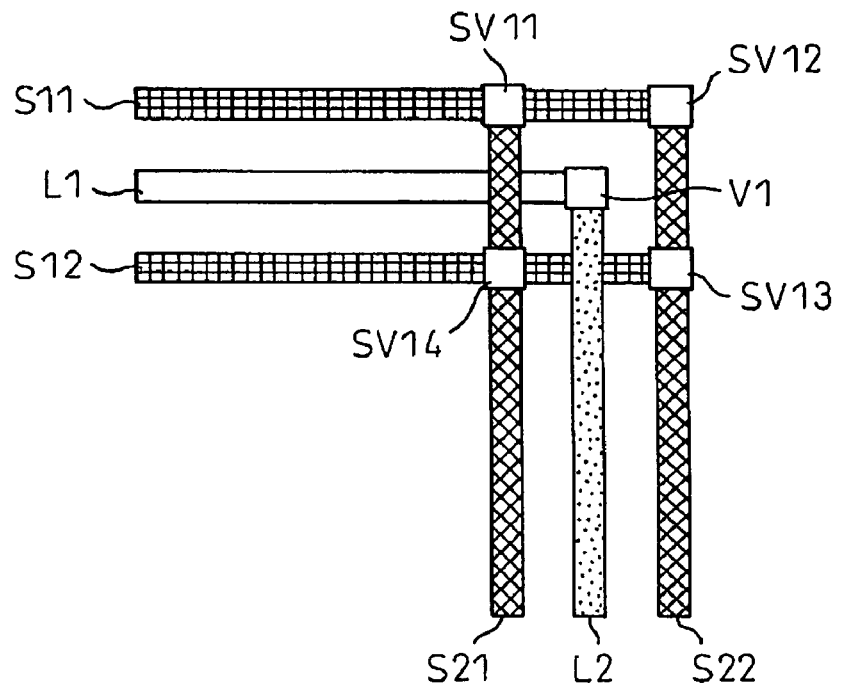
FIG. 10A is a diagram showing a wiring layout before a signal line is partially deleted.
Figure 10B:
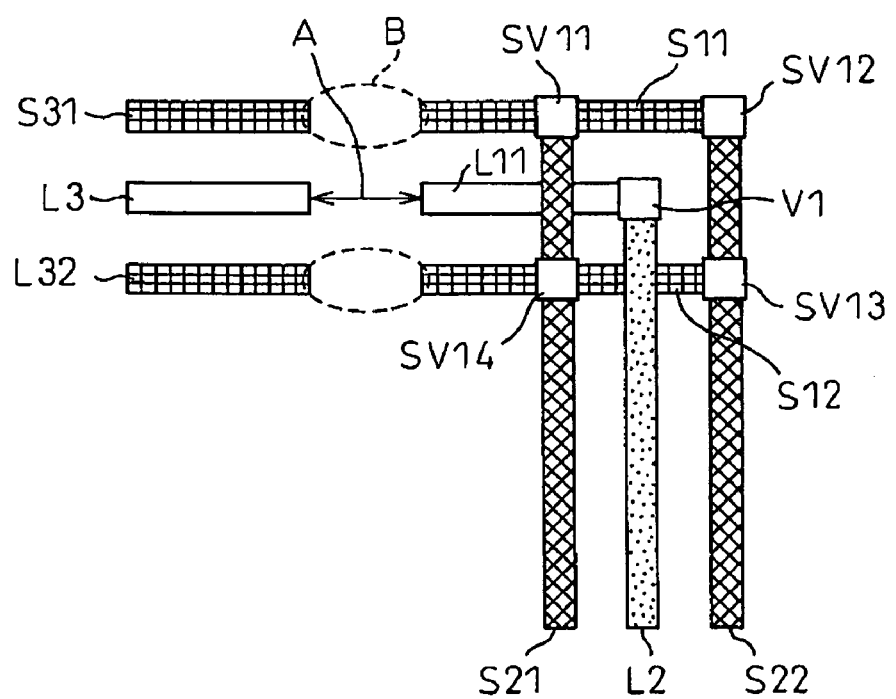
FIG. 10B is a diagram showing a wiring layout after the signal line is partially deleted.

FIGS. 10A and 10B are diagrams explaining the shield line placement when a signal line is partially deleted: FIG. 10A is a diagram showing the wiring layout before the signal line is partially deleted, and FIG. 10B is a diagram showing the wiring layout after the signal line is partially deleted.

When editing is done to partially delete the signal line L1 provided with shield lines (S2), the wiring processing unit 51 edits the wiring data of the signal line L1 in the signal line table T1 to shorten it, while adding the wiring data of a new signal line L3, thereby deleting the portion A of the original signal line L1 as shown in FIG. 10B (S4, S11, S21). In this case, the information as to whether shielding is needed or not and the rule selection information are copied from the wiring data of the original signal line L1 into the wiring data of the signal line L3 newly added by separating from the signal line L1.

A determination is made as to whether shielding is needed for the signal line L1 (S12), and a determination is also made as to the presence or absence of the shield line wiring data associated with the wiring data of the signal line L1 (S13, S31).

Since the signal line L1 is provided with the shield lines S11 and S12, the shield line processing unit 61 edits the wiring data of the shield lines S11 and S12 associated with the wiring data of the signal line L1, and shortens the shield lines S11 and S12 so that they are just sufficient to shield the signal line L1 (S37).

After that, a determination is also made as to whether shielding is needed for the signal line L3 (S12). Here, since the information as to whether shielding is needed for the signal line L3 is the same as that for the signal line L1, it is determined in step S12 that shielding is needed.

Further, a determination is made as to the presence or absence of the shield line wiring data associated with the wiring data of the signal line L3 (S13, S31). Since the signal line L3 is a signal line newly added by separating from the signal line L1, it is determined that there are no shield lines associated with it. Then, the shield line processing unit 61 automatically generates in accordance with the preloaded wiring rule (S1) the wiring data of the shield lines S31 and S32 to be provided for the signal line L3 (S32), and stores the generated wiring data in the shield line table T2.

By shortening the shield lines S11 and S12 and adding S31 and S32 in this way, the portions B and C corresponding to the deleted portion A of the signal line L1 are deleted from the original shield lines S11 and S12, resulting in the formation of the shield lines as shown.

Figure 11A:
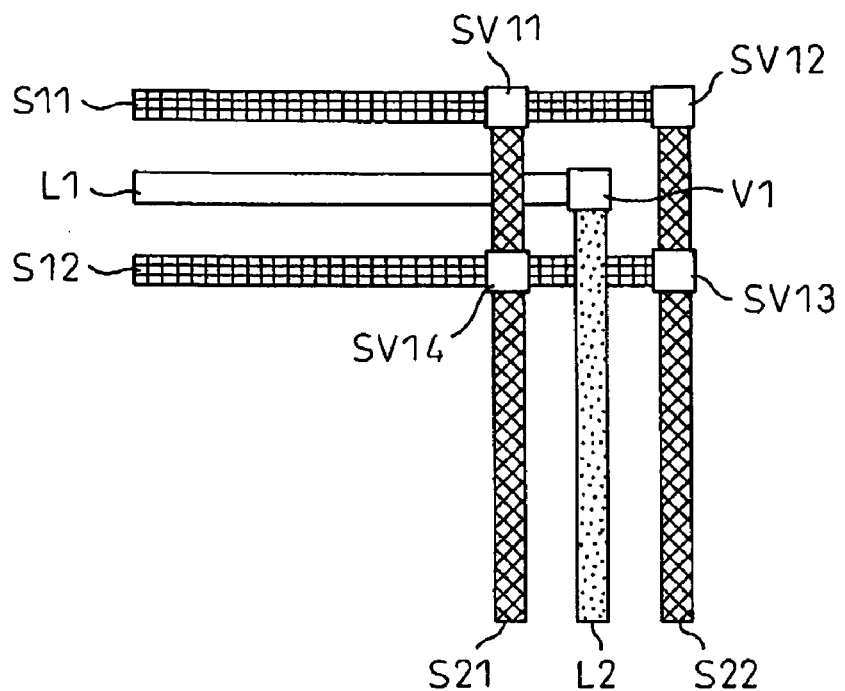
FIG. 11A is a diagram showing a wiring layout before a signal line is extended.
Figure 11B:
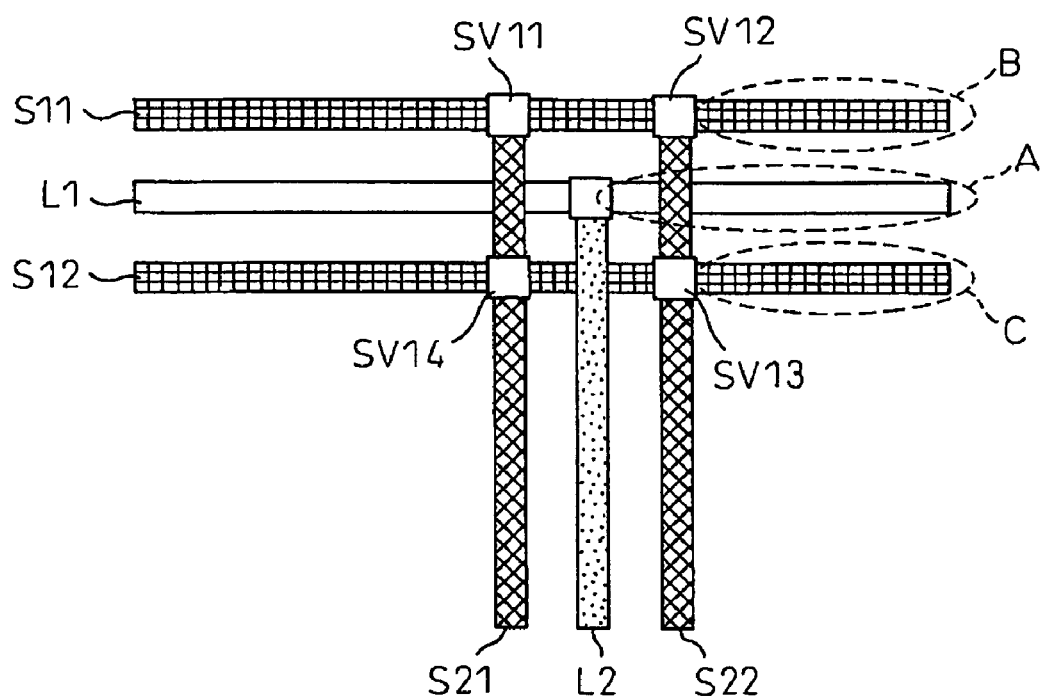
FIG. 11B is a diagram showing a wiring layout after the signal line is extended.

FIGS. 11A and 11B are diagrams for explaining the shield line placement when a signal line is extended: FIG. 11A is a diagram showing the wiring layout before the signal line is extended, and FIG. 11B is a diagram showing the wiring layout after the signal line is extended.

When editing is done to extend the signal line L1 provided with shield lines (S2), the wiring processing unit 51 edits the wiring data of the signal line L1 in the signal line table T1 to extend it (S4, S11, S21).

After that, a determination is made as to whether shielding is needed for the signal line L1 (S12), and a determination is also made as to the presence or absence of the shield line wiring data associated with the wiring data of the signal line L1 (S13, S31).

Since the signal line L1 is provided with the shield lines S11 and S12, the shield line processing unit 61 edits the wiring data of the shield lines S11 and S12 associated with the wiring data of the signal line L1, and extends the shield lines S11 and S12 so that they are just sufficient to shield the extended signal line L1 (S37).

Figure 12A:
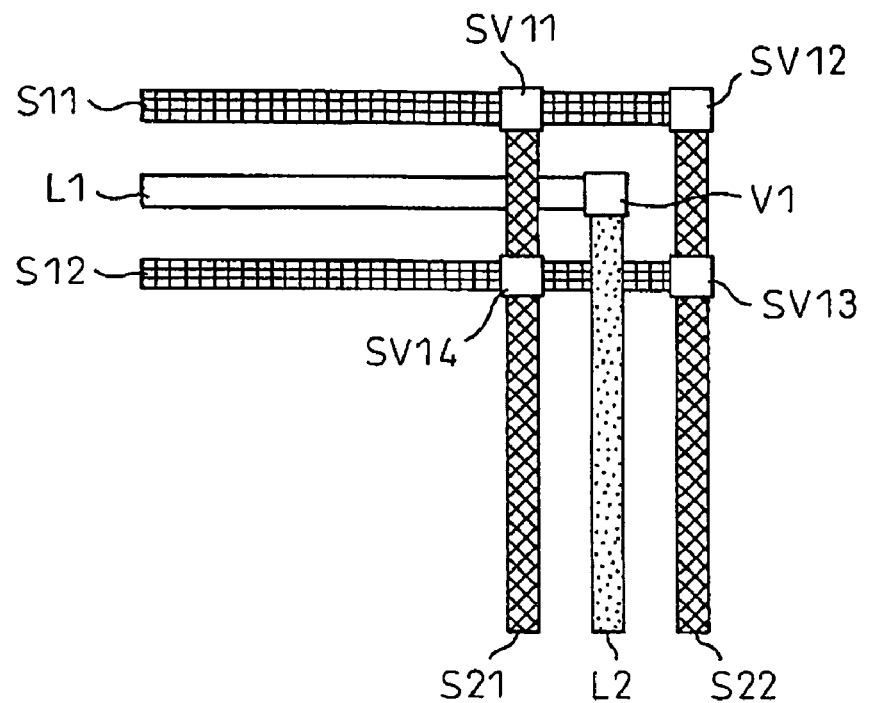
FIG. 12A is a diagram showing a wiring layout before signal lines are shortened.
Figure 12B:
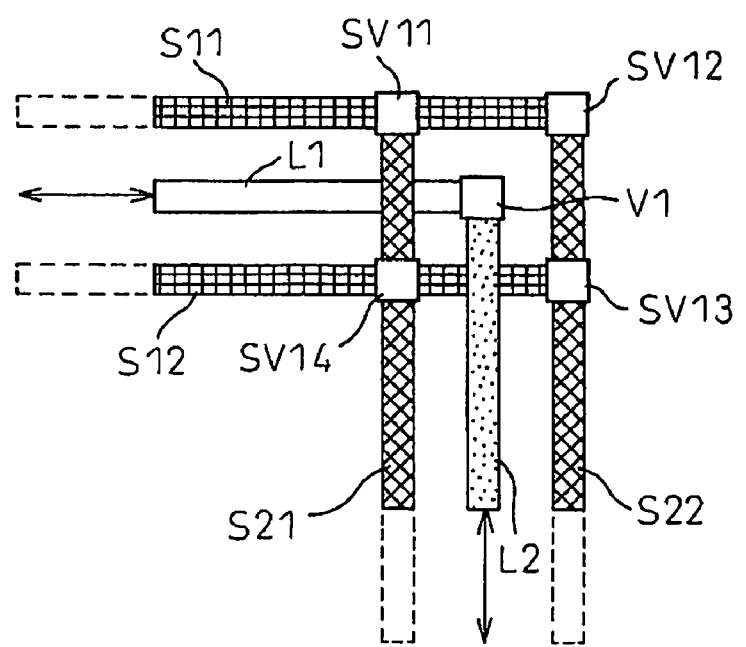
FIG. 12B is a diagram showing a wiring layout after the signal lines are shortened.

FIGS. 12A and 12B are diagrams for explaining the shield line placement when signal lines are shortened: FIG. 12A is a diagram showing the wiring layout before the signal lines are shortened, and FIG. 12B is a diagram showing the wiring layout after the signal lines are shortened.

When editing is done to shorten the signal lines L1 and L2 provided with shield lines (S2), the wiring processing unit 51 edits the wiring data of the signal lines L1 and L2 in the signal line table T1 to shorten them (S4, S1, S21).

After that, a determination is made as to whether shielding is needed for the signal lines L1 and L2 (S12), and a determination is also made as to the presence or absence of the shield line wiring data associated with the wiring data of the signal lines L1 and L2 (S13, S31).

Since the signal line L1 is provided with the shield lines S11 and S12, and the signal line L2 is likewise provided with the shield lines S21 and S22, the shield line processing unit 61 edits the wiring data of the shield lines S11 and S12 associated with the wiring data of the signal line L1, and shortens the shield lines S11 and S12 so that they are just sufficient to shield the signal line L1. Likewise, it edits the wiring data of the shield lines S21 and S22 associated with the wiring data of the signal line L2, and shortens the shield lines S21 and S22 so that they are just sufficient to shield the signal line L2 (S37).

Figure 13A:
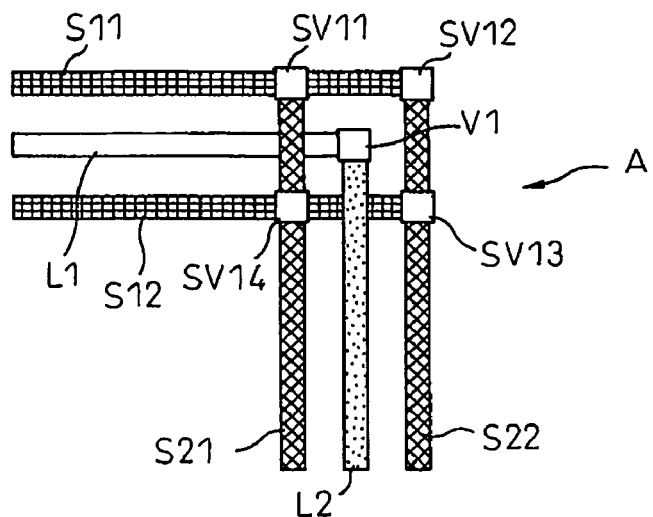
FIG. 13A is a diagram showing a wiring layout before signal lines are moved.
Figure 13B:
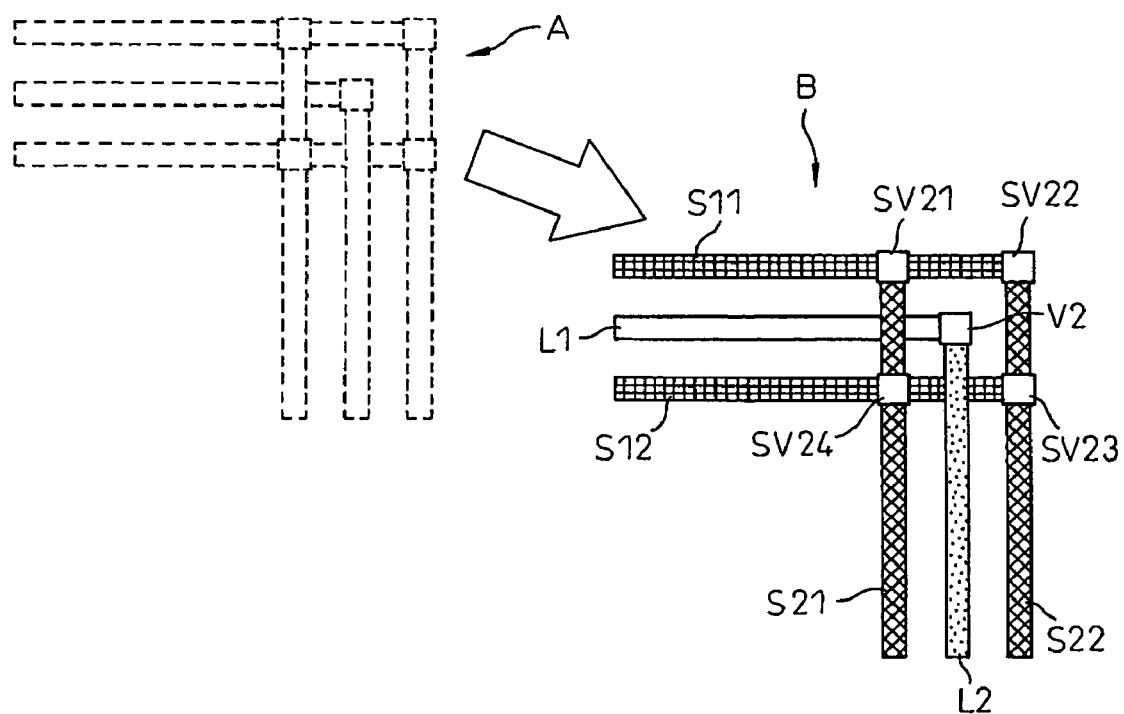
FIG. 13B is a diagram showing a wiring layout after the signal lines are moved.

FIGS. 13A and 13B are diagrams explaining the shield line placement when wiring lines are moved: FIG. 13A is a diagram showing the wiring layout before the wiring lines are moved, and FIG. 13B is a diagram showing the wiring layout after the wiring lines are moved.

When the signal lines L1 and L2 placed in position A on the circuit diagram are moved to position B on the circuit diagram (S2), the wiring processing unit 51 edits the coordinate information contained in the wiring data of the signal line L1 and L2 in the signal line table T1, and repositions the signal lines L1 and L2 (S4, S11, S21). Then, the via processing unit 52 deletes the via V1 initially located in position A from the wiring result data storage unit 20, generates the wiring data for a via V2 for connecting the signal lines L1 and L2 relocated to position B, and stores the generated wiring data in the wiring result data storage unit 20 (S22, S23).

A determination is then made as to whether shielding is needed for the signal lines L1 and L2 (S12), and a determination is also made as to the presence or absence of the shield line wiring data associated with the wiring data of the signal lines L1 and L2 (S13, S31).

Since the signal line L1 is provided with the shield lines S11 and S12, and the signal line L2 is likewise provided with the shield lines S21 and S22, the shield line processing unit 61 edits the wiring data of the shield lines S11 and S12 in accordance with the preloaded wiring rule (S1), and changes their position information to move them to position B. Likewise, the wiring data of the shield lines S21 and S22 is edited, and the shield lines S21 and S22 are moved to position B by changing their position information (S37).

Then, the shield via processing unit 62 deletes the wiring data concerning the vias SV11, SV12, SV13, and SV14 initially located in position A from the wiring result data storage unit 20, generates the wiring data concerning the vias SV21, SV22, SV24, and SV23 for connecting the shield lines S11 and S21, S11 and S22, S12 and S21, and S12 and S22, respectively, moved to position B, and stores the generated wiring data in the wiring result data storage unit 20 (S38).

Figure 14A:
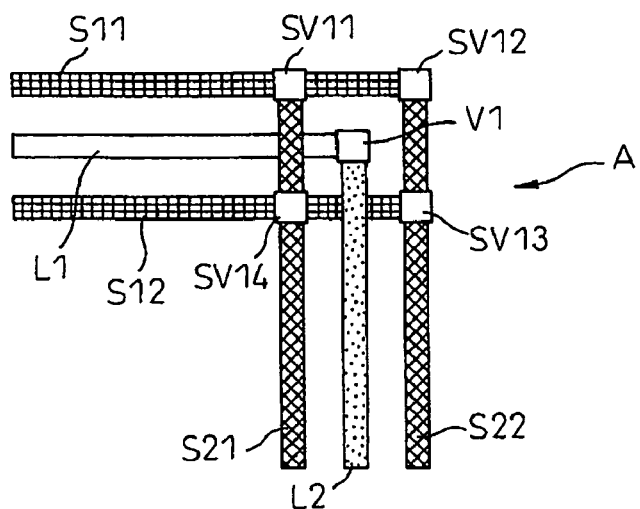
FIG. 14A is a diagram showing a wiring layout before signal lines are copied.
Figure 14B:
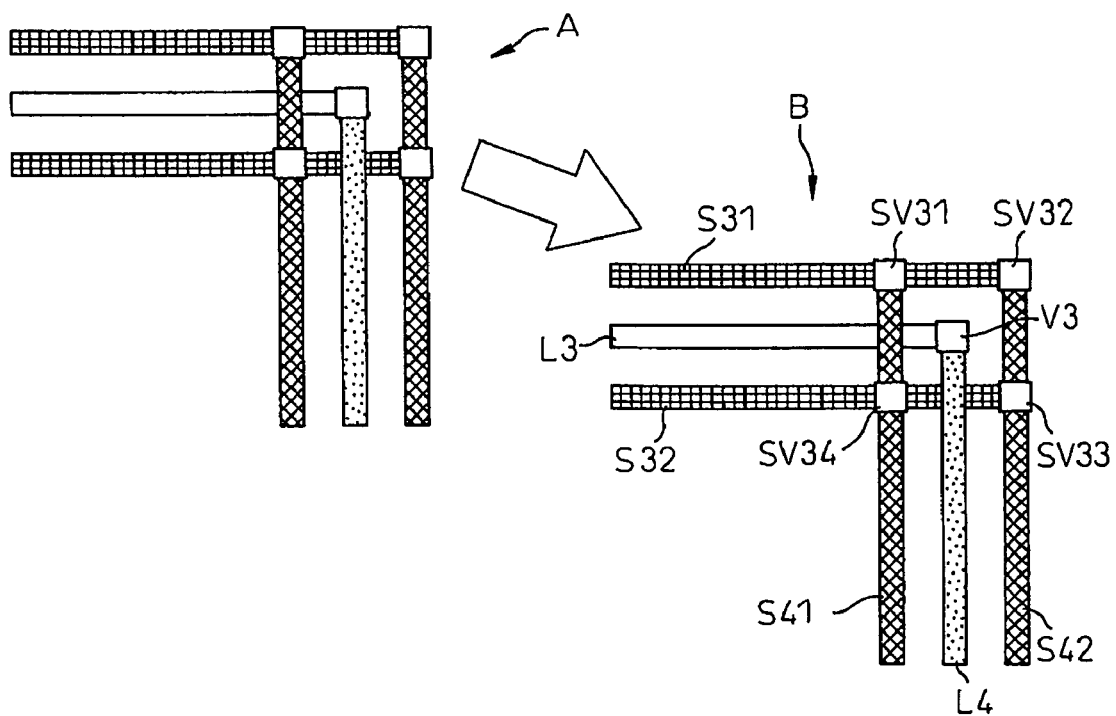
FIG. 14B is a diagram showing a wiring layout after the signal lines are copied.

FIGS. 14A and 14B are diagrams explaining the shield line placement when wiring lines are copied: FIG. 14A is a diagram showing the wiring layout before the wiring lines are copied, and FIG. 14B is a diagram showing the wiring layout after the wiring lines are copied.

When the signal lines L1 and L2 placed in position A on the circuit diagram are copied to position B on the circuit diagram (S2), the wiring processing unit 51 loads the wiring data of the signal lines L1 and L2 from the signal line table T1, generates wiring data for signal lines L3 and L4, the wiring data being the same as that for the signal lines L1 and L2 except the coordinate information, and stores the generated wiring data in the signal line table T1 maintained in the wiring result data storage unit 20 (S4, S11, S21). On the other hand, wiring data for a via V3 for connecting the signal lines L3 and L4 is generated by the via processing unit 52 and stored in the wiring result data storage unit 20 (S22, S23).

A determination is then made as to whether shielding is needed for the signal lines L3 and L4 (S12). Since the information as to the presence or absence of shield lines for the signal lines L3 and L4 is the same as that for the signal lines L1 and L2, respectively, it is determined in step S12 that shield lines are needed.

Further, a determination is made as to the presence or absence of the shield line wiring data associated with the wiring data of the signal lines L3 and L4 (S13, S31). Since the signal lines L3 and L4 are newly added wiring lines, it is determined that there are no shield lines associated with them.

The shield line processing unit 61 in the shield wiring unit 60 automatically generates in accordance with the preloaded wiring rule (S1) the wiring data of the shield lines S31 and S32 for the signal line L3 and the wiring data of the shield lines S41 and S42 for the signal line L4 (S32), and stores the generated wiring data in the signal line table T2. The shield via processing unit 62 generates the wiring data concerning the vias SV31, SV32, SV34, and SV33 for connecting the shield lines S31 and S41, S31 and S42, S32 and S41, and S32 and S42, respectively (S34), and stores the generated wiring data in the wiring result data storage unit 20.

Examples of the various modes of the shield lines and vias that can be defined by the wiring rules and via rules will be described below with reference to FIGS. 15A, 15B, 15C, and 16 to 18.

The following discusses the process in which the shield lines are automatically placed simultaneously with the placement of the signal lines by software.

Figure 15A:
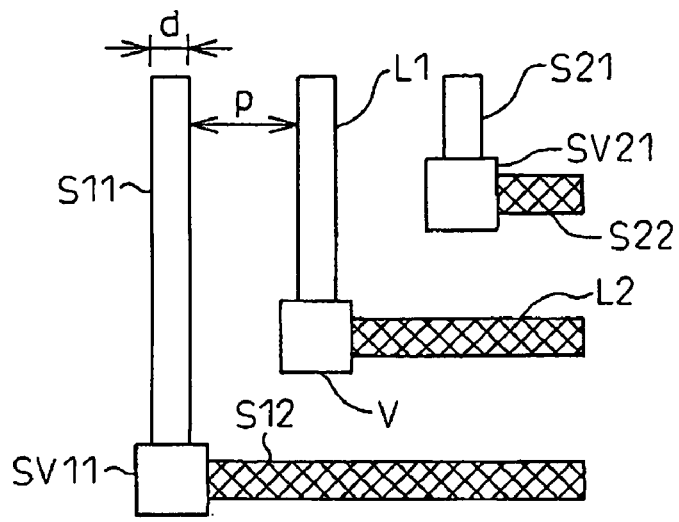
FIG. 15A is a diagram showing an example of shielding simply provided along a signal line.

In FIG. 15A, the wiring lines shown by hollow regions and the wiring lines shown by cross-hatched regions respectively indicate the wiring lines, i.e., the signal line and its associated shield lines, and the wiring lines shown by hollow regions are placed on the same layer to each other, as well as the wiring lines shown by cross-hatched regions are placed on the same layer to each other; more specifically, the signal line and its associated shield lines shown by hollow regions are placed on a different layer than the layer where the signal line and its associated shield lines shown by cross-hatched regions are placed. Further, V, SV11, and SV12 indicate vias. V is a via for connecting the signal lines L1 and L2, SV11 is a via for connecting the shield lines S11 and S12, and SV12 is a via for connecting the shield lines S21 and S22.

When generating the shield lines along the signal lines L1 and L2, if a user interface capable of entering various parameters of the shield lines is designed, and the line width d of the shield lines S11, S12, S21, and S22 associated with the signal lines L1 and L2 and the spacing p between signal line and shield line are input before and after the signal line placement instruction, then the placement of the shield lines shown in FIG. 15A can be accomplished.

However, if the shield lines are to be automatically placed by replying on such user interface inputs, the input of the parameters for implementing intricate shield line placement, such as required, in particular, in the design of high-end LSIs, will become extremely complex. Accordingly, the above method that specifies the line width d and the spacing p via the user interface may encounter a problem depending on the configuration of the shield line placement. As an example, consider the case of placing the shield lines to shield the signal lines L1 and L2 connected so as to bend at right angles to each other from one layer to another. In this case, by simply specifying the shield line width d and the signal line to shield line spacing p, other parameters cannot be specified. As a result, the placement of the shield lines S11, S12, S21, and S22 that can be generated by entering these parameters is limited to a simple configuration such as shown in FIG. 15A. In the configuration shown in FIG. 15A, there is left an area (near the region V) where the signal lines are not flanked by the shield lines, and this can result in insufficient shielding of the signal lines.

On the other hand, if various parameters and mathematical equations for defining the configuration of the shield line placement are predefined as wiring rules and prestored as an external file, as in the present embodiment, the shield lines can be routed without having to input complex parameters but by just reading out the file each time there arises a need to place the shield lines. This makes it possible to place the shield lines in a manner that would not be possible with the method of inputting the parameters via the user interface. For example, as shown in the example of FIG. 15B, for the signal lines L1 and L2 between which a layer change is made, a wiring rule can be defined that places or extends the shield lines into regions A and B, while making it possible to place additional vias SV12 and SV22.

Figure 15B:
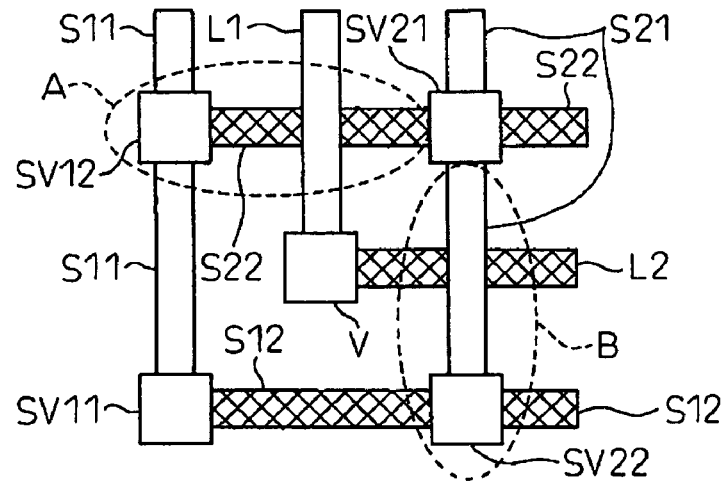
FIG. 15B is a diagram showing an example of shielding that can be achieved by the embodiment.

In the example of FIG. 15B, since an additional shield line can be formed in the region A, the shield lines can be provided along the entire length of the signal line L2. Likewise, since an additional shield line can be formed in the region B, the signal line L1 can be sufficiently shielded along its entire length.

The shield lines shown in FIG. 15B are generated by referring to the wiring data of the signal lines L1 and L2. That is, from the wiring data of the respective signal lines, it is found that the signal lines L1 and L2 are formed up to the position of the via V. Further, as previously described, the information concerning the shield line width and the information concerning the signal line to shield line spacing are given. Therefore, based on these pieces of information, the computing unit determines the positions and lengths of the shield lines required to shield the signal lines L1 and L2 along the entire lengths thereof and the placement positions of the vias needed to connect the shield lines between layers, and generates the wiring data of the shield lines.

Further, if various parameters and mathematical equations for defining the shape and size of the vias are predefined as via rules and prestored as an external file, the vias to be automatically generated can be defined as desired.

Figure 15C:
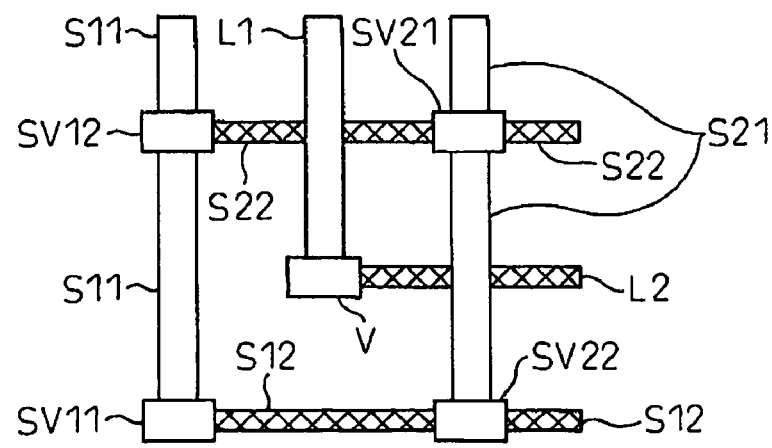
FIG. 15C is a diagram showing an example of shielding for the case where the signal line width changes when changing layers.

In the example shown in FIG. 15C, the wiring lines shown by hollow regions and the wiring lines shown by cross-hatched regions, respectively placed on different layers, have different line widths, and the vias SV11 to SV22, each having different vertical and horizontal dimensions to match the different line widths, are formed for the shield lines.

When forming the vias, first the line width of each of the signal line L1 and its shield lines S11 and S21 and the line width of each of the signal line L2 and its shield lines S12 and S22 are identified based on the wiring data of the respective lines. After that, the horizontal width of each via is determined so as to match the line width of each of the signal line L1 and its shield lines S11 and S21, and the vertical width so as to match the line width of each of the signal line L2 and its shield lines S12 and S22.

As a via rule for defining such vias, a two-dimensional table is defined that uniquely determines the horizontal and vertical dimensions of each via, for example, by using as an index the line widths of the two wiring lines connected by changing layers, or a mathematical equation is defined that determines the horizontal and vertical dimensions of each via in proportional relationship to the line widths connected to it. Further, by changing the rule as needed, the via size and shape can be changed according to the layer where the wiring lines are routed.

According to the present embodiment, it is also possible to define a wiring rule that also places shield lines on a different layer than the layer where the signal line is formed. In the example of the shield line wiring rule shown in FIG. 16, the signal line L is placed on the layer LO. For this signal line L, shield lines S1 and S2 are placed on the layer LO. On a layer LU above the layer LO, there are placed a shield line S3 directly above the signal line L and shield lines S5 and S6 diagonally above it. Further, on a layer LD below the layer LO, there are placed a shield line S4 directly below the signal line L and shield lines S7 and S8 diagonally below it. Thus, the signal line L is covered by a total of eight shield lines arranged in a lattice configuration.

Further, bridges B1 and B2 are placed on the layer LU to connect the shield lines S3, S5, and S6 placed on the same layer, and bridges B3 and B4 are placed on the layer LD to connect the shield lines S4, S7, and S8 placed on the same layer. There are also formed vias V1 and V2 for interconnecting the shield lines S2, S6, and S7 placed on the three different layers LO, LU, and LD, and vias V3 and V4 for interconnecting the shield lines S1, S5, and S8.

The wiring rule applied here first sets the layer LO where the signal line is to be placed, and then sets the layers LU and LD different than the layer LO where the signal line is placed. The shield lines to be placed on the layer LO are generated by referring to the line widths of the shield lines S1 and S2 and the shield line to signal line L spacing, as earlier described.

Further, to place the shield line S5 on the layer LU, the line width of the shield line S5 is set, and the spacing between the shield lines S5 and S3 is set. The shield line S6 to be placed on the layer LU and the shield lines S8, S4, and S7 to be placed on the layer LD are likewise generated.

To form the bridges, the spacing between the bridges B1 and B2 and the line width of each bridge are set. Information indicating which shield lines are to be connected by the bridges is also set appropriately.

On the other hand, to form the vias to interconnect the shield lines between the different layers, information such as the shape, size, kind, etc. of the vias V1 to V4 is set.

Figure 16:
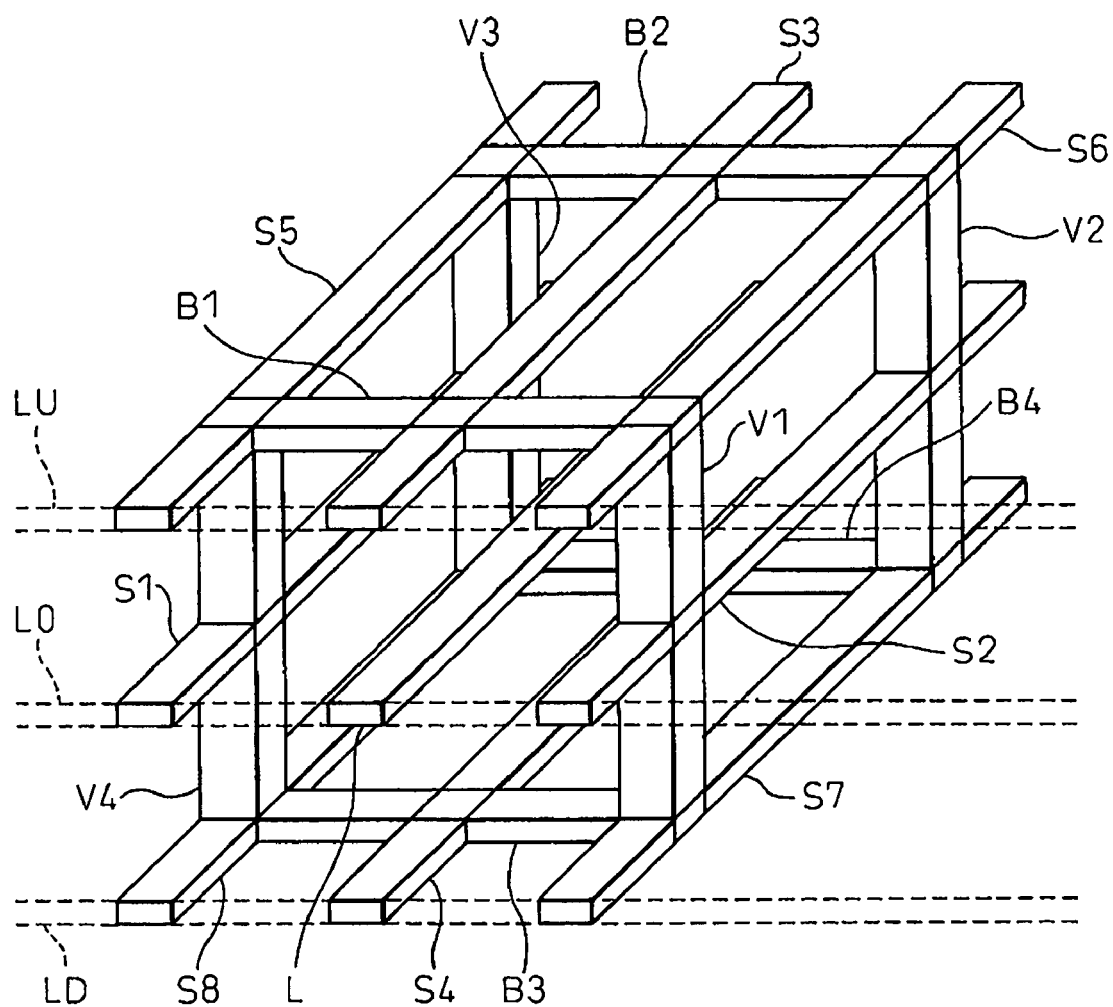
FIG. 16 is a diagram showing an example of shielding having oblique shields and bridges.

If the above setting information is prestored in the design apparatus 1 by being associated with the information indicating the types and structures of the shield lines, bridges, and vias, the shield line configuration shown in FIG. 16 can be accomplished without having to manually enter the parameters of the shield lines and signal lines when placing them, but by simply entering information specifying the type of shield line to be placed.

Figure 17:
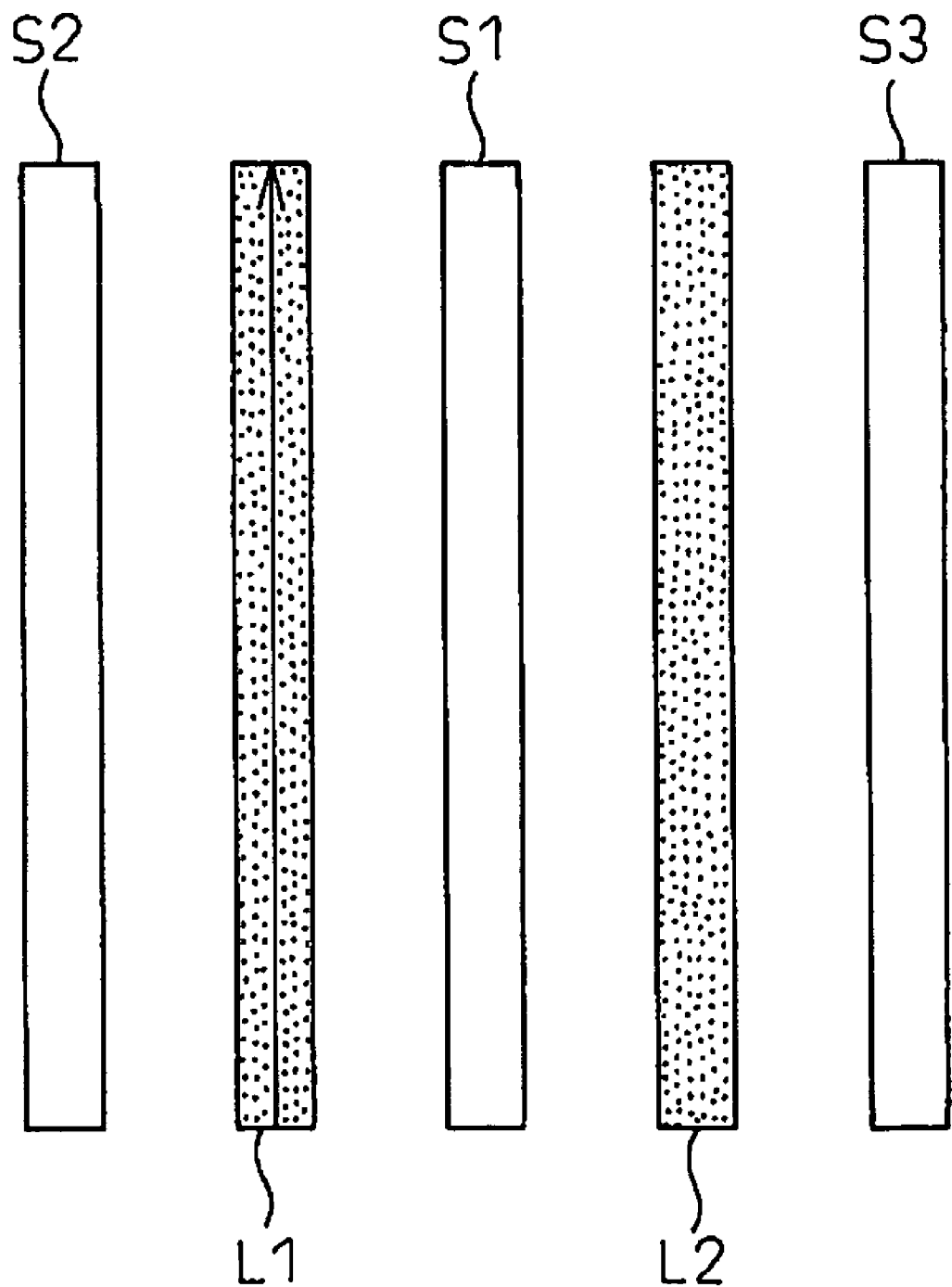
FIG. 17 is a diagram showing an example of a stripe wiring configuration with shields.

According to the present embodiment, it is also possible to define a wiring rule for simultaneously placing stripe wiring lines comprising a plurality of parallel signal lines. For example, if two signal lines L1 and L2, such as the stripe wiring lines L1 and L2 shown in FIG. 17, are to be formed by placing shield lines for shielding the signal lines L1 and L2, the wiring rule should be defined so that the shield lines S1 to S3 are simultaneously placed one between the signal lines L1 and L2 and the others outside the respective signal lines. In this case, rules are set that define the spacing between the signal lines L1 and L2, the required signal line to shield line spacing, the shield line width, etc., and rules are also set so that a shield line is formed between the adjacent signal lines.

Figure 18:
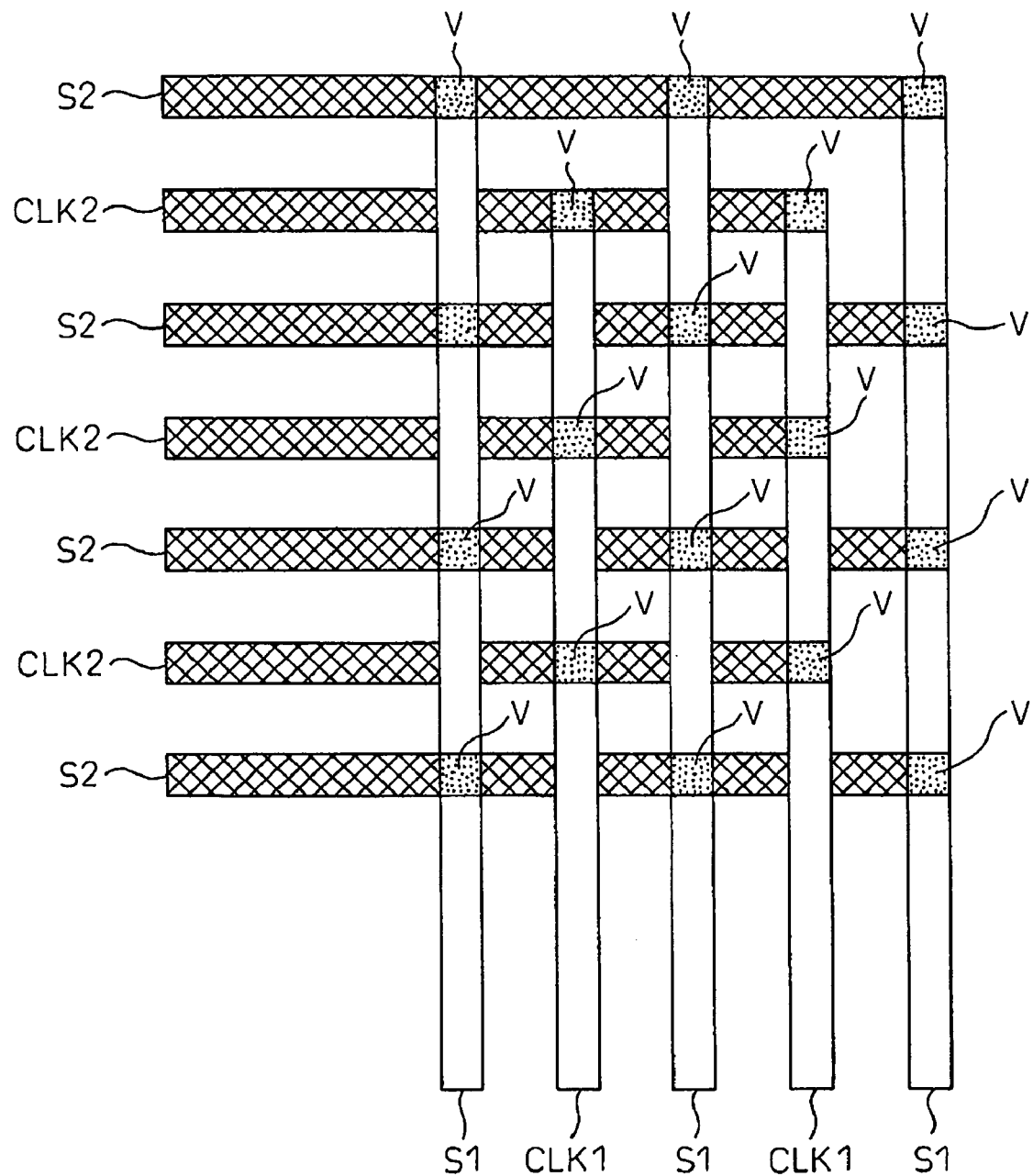
FIG. 18 is a diagram showing an example of how shields are provided at layer-change points in the stripe wiring configuration.

Furthermore, wiring rules may also be set to define how the shield lines and the vias should be placed when a layer change occurs in such stripe wiring lines. FIG. 18 shows an example of the shield line placement when the stripe wiring lines comprising two clock lines CLK1 formed on one layer are connected to the stripe wiring lines comprising three clock lines CLK2 formed on another layer. In FIG. 18, the shield lines S1 are formed on the same layer as the clock lines CLK1, and the shield lines S2 are formed on the same layer as the clock lines CLK2. Further, reference character V indicates vias.

In order to achieve the shield line routing shown in FIG. 18, rules are set that define the clock line width, the spacing between clock lines, the shield line width, the shield line to clock line spacing, etc. for the layer where the clock lines CLK2 are formed as well as for the layer where the clock lines CLK1 are formed. Rules are also set so that a shield line is formed between each clock line, and so that the clock lines connected between the layers are shielded along the entire length thereof.

Figure 19:
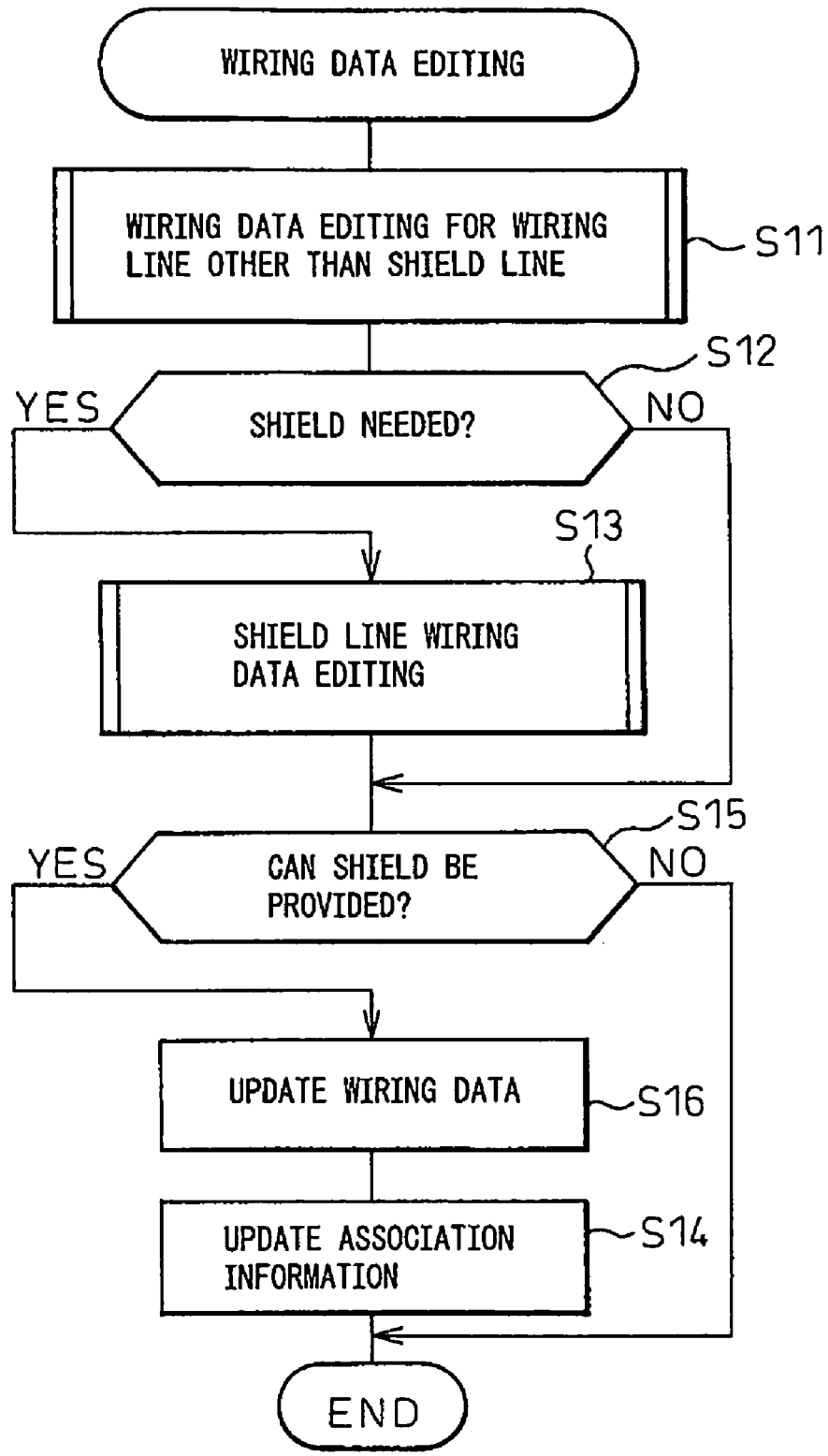
FIG. 19 is a flowchart illustrating a routine having a step for preventing a signal line from being placed in such a manner that a shield line cannot be provided for it.

Further, the design program 40 may include a step for preventing the operator from placing a signal line in such a manner that a shield line cannot be provided for it. FIG. 19 is a flowchart illustrating the wiring data editing routine that includes a step for preventing a signal line from being placed in such a manner that a shield line cannot be provided for it. The flowchart shown in FIG. 19 is one that replaces the flowchart shown in FIG. 5.

In the routine shown in FIG. 19, the signal line wiring data generated in step S11 and the shield line wiring data generated in step S13 are temporarily stored.

Then, in step S15, the shield line processing unit 61 in the shield wiring unit 60 determines whether shield lines conforming to the wiring rule can be generated for the signal line edited in step S11. In step S15, the positional relationship to other circuit elements arranged on the circuit is checked based on the generated shield line placement data, and it is determined whether such shield lines can be placed or not. If it is determined that shield lines can be placed, the wiring data is updated using the temporarily stored data (S16). If it is determined that shield lines cannot be placed, the temporarily stored data is discarded, and the wiring data is not updated.

Figure 20A:
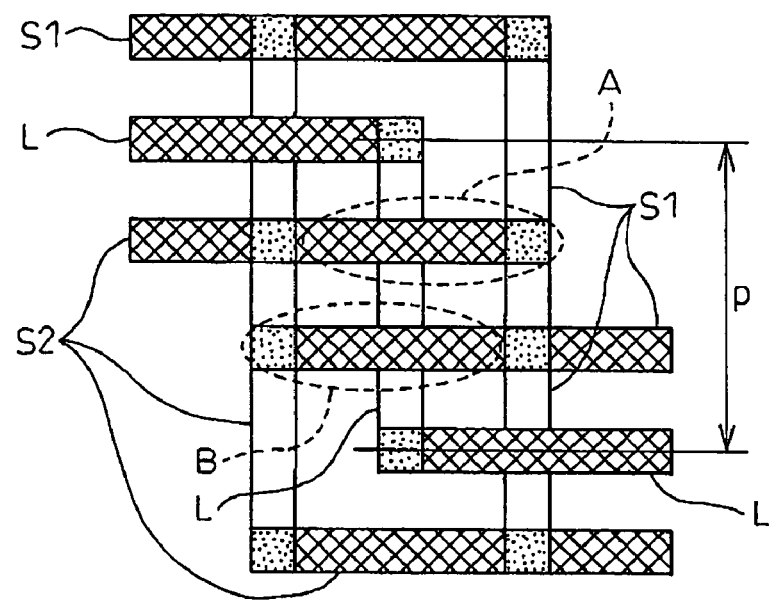
FIG. 20A is a diagram showing an example of shielding provided for a crank-like signal line.

For example, when placing a signal line L bent like a crank as shown in FIG. 20A, shield lines conforming to the rule cannot be formed unless the length p of the portion corresponding to the handle of the crank is made sufficiently long. In the example of FIG. 20A, since the spacing p between the two horizontally extending portions of the signal line L is relatively large, shield lines can be placed for the signal line L.

Figure 20B:
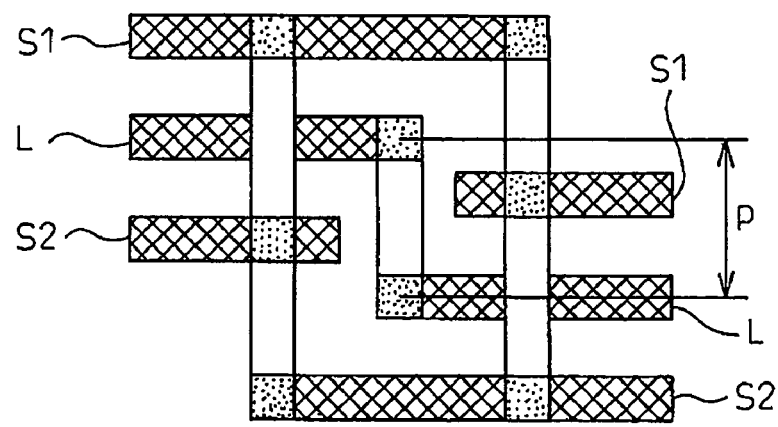
FIG. 20B is a diagram showing an example of incomplete shielding provided for a crank-like signal line.

On the other hand, in the example of FIG. 20B, if shield lines are to be formed in portions A and B, since the spacing p is not large enough, the signal line to shield line spacing and the shield line width as required by the rule cannot be secured. As a result, in the example of FIG. 20B, the shield lines are cut off part of the way, resulting in incomplete formation of the shield lines.

Accordingly, when placing the crank-like signal line L as shown in FIG. 20A, the shield line processing unit 61 determines whether shield lines conforming to the wiring rule can be formed or not, by checking whether the length p of the portion corresponding to the handle of the crank is longer than the length required to allow the placement of shield lines as prescribed by the wiring rule. If it is determined that it is difficult to form the shield lines conforming to the wiring rule, a message should be output that, for example, urges the operator to redo the placement of the signal line. Then, when the placement of the signal line is redone, the shield line processing unit 61 again checks whether the shield lines can be placed or not.

Further, according to the present embodiment, for a given functional cell placed on the circuit diagram, a wiring rule can be set that prohibits the placement of shield lines in a region within a predetermined distance of that cell. FIG. 21 is a diagram for explaining such a rule.

When such a wiring rule is applied to the shield line wiring data being edited, the shield line processing unit 61 identifies, from the local connection data stored in the netlist storage unit 23 shown in FIG. 3, a cell C having a terminal T to which the signal line L associated with the shield lines S1 and S2 is connected, and checks whether the cell C is a cell within a predetermined distance of which the placement of shield lines is prohibited according to the wiring rule. If it is determined that the cell is a cell for which the placement of shield lines is prohibited, the shield line processing unit 61 determines the boundary of the cell C based on the library data of the cell C stored in the cell library storage unit 22 and on the position information contained in the cell placement data stored in the cell placement result data storage unit 21, determines a boundary R spaced from the boundary of the cell C by the predetermined distance d prescribed by the wiring rule, and deletes the portions of the shield lines S1 and S2 that are located inside the boundary R.

Figure 22A:
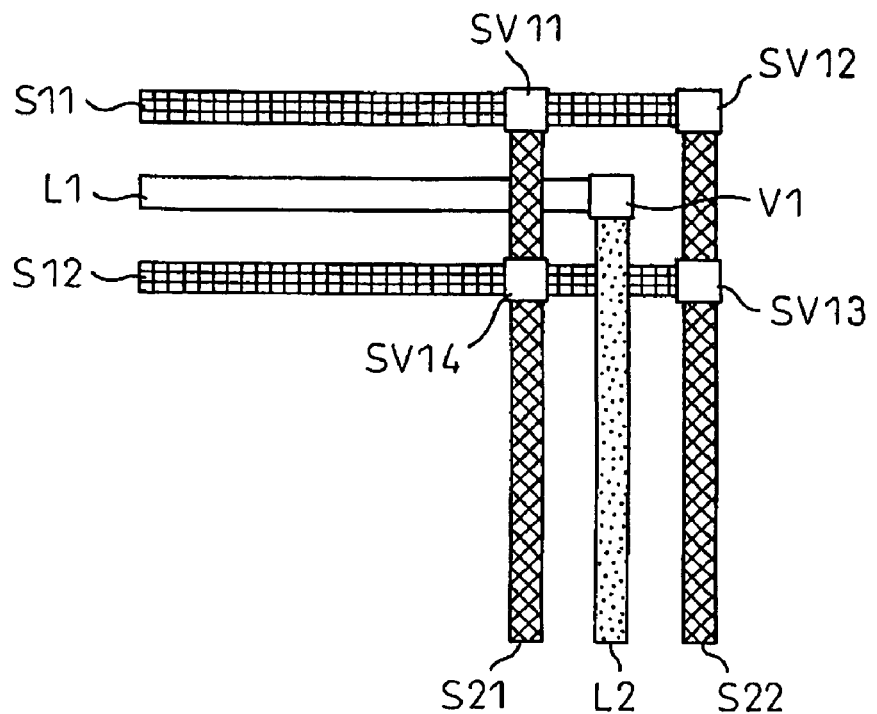
FIG. 22A is a diagram showing the original wiring layout before a design rule is changed.
Figure 22B:
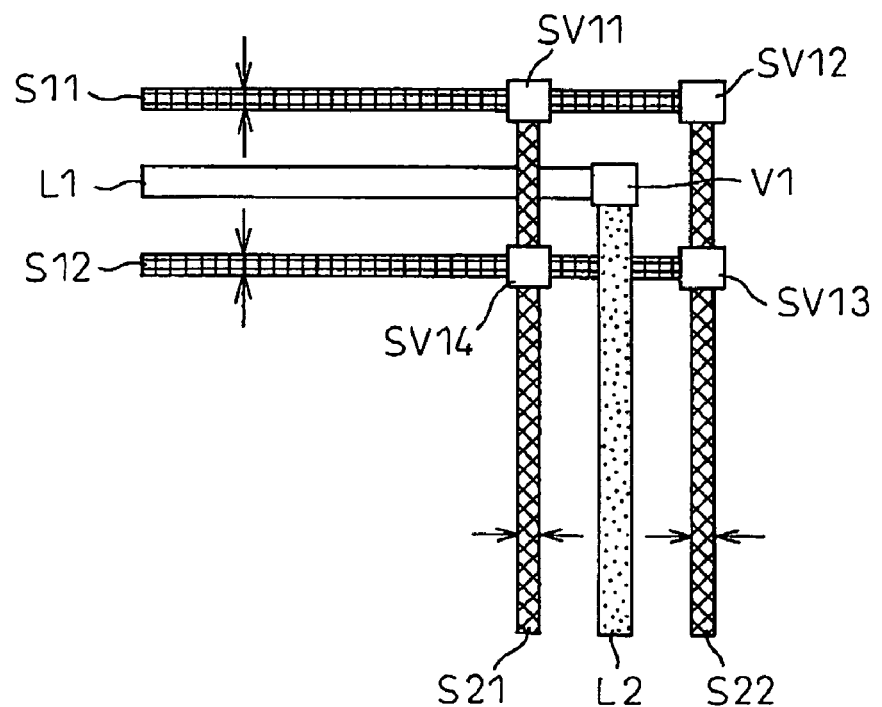
FIG. 22B is a diagram showing a wiring layout corrected to match the changed design rule.

The design program 40 may further include a step for correcting in a collective manner the plurality of shield lines generated in accordance with the previous shield line design rule when the design rule is changed. FIGS. 22A and 22B are diagrams for explaining how the shield lines are corrected when the design rule is changed: FIG. 22A is a diagram showing the wiring layout before the design rule is changed, and FIG. 22B is a diagram showing the wiring layout after the design rule is changed. Reference characters L1, L2, S11 to S22, V1, and SV11 to SV14 used here are the same as those in FIG. 8A.

The following assumes the case where the design rule is changed for the shield lines provided for the signal lines L1 and L2. As can be seen from a comparison between the wiring layouts before and after the design rule change, the design rule for defining the shield lines S11 and S12 provided for the signal line L1 and the shield lines S21 and S22 provided for the signal line L2 is changed so as to reduce the width of each shield line.

When the design rule is changed in this way, the design program 40 loads the wiring rule information reflecting the design rule change from the wiring rule data storage unit 32, and corrects the wiring data so that the existing shield lines are corrected to conform to the changed design rule. Alternatively, the existing shield lines are deleted, and the wiring data that conforms to the changed design rule is generated.

Figure 23:
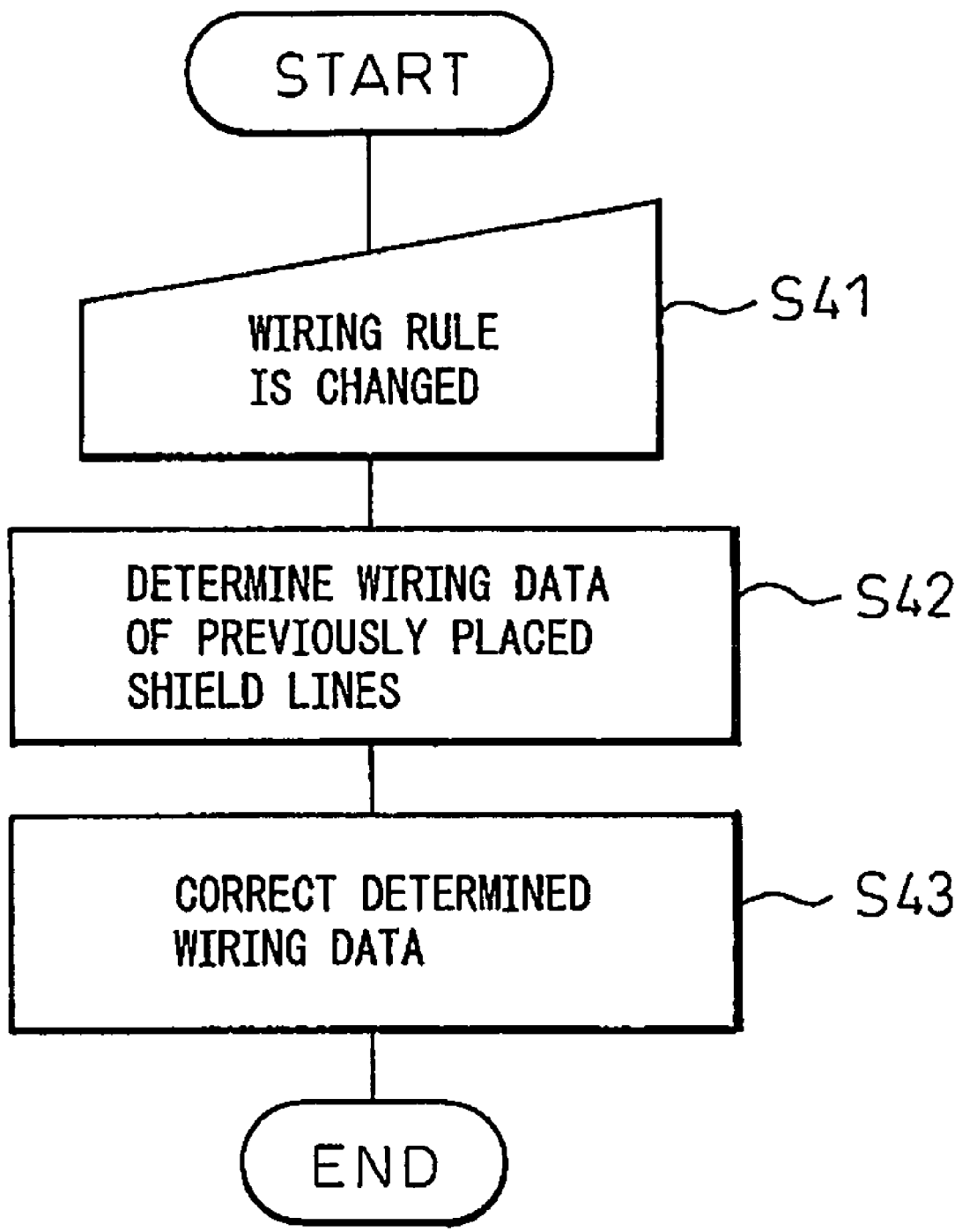
FIG. 23 is a flowchart showing a first example of a method for correcting a plurality of shield lines in a collective manner to match the changed design rule.

FIG. 23 is a flowchart showing a first example of such a collective correction method. In step S41, the new wiring rule changed so as to conform to the changed design rule is stored as an external file in the wiring rule data storage unit 32. In this case, the operator enters instruction information that designates the changed wiring rule (for example, index information that identifies the wiring rule) into the computing unit 2.

In step S42, the shied line processing unit 61 determines the shield lines placed in accordance with the existing wiring rule before the wiring rule is changed. In order to accomplish this, instruction information designating the wiring rule to which the shield lines should conform, may be included in advance in the shield line wiring data, and the shield lines placed in accordance with this wiring rule may be extracted by comparing the instruction information with the wiring rule designating instruction information entered in step S41.

Alternatively, instruction information designating the wiring rule to which the shield lines should conform, may be included in the wiring data concerning the signal line which is simultaneously placed with this shield lines, and by comparing this instruction information with the instruction information entered in step S41, the signal line whose wiring data contains the instruction information designating the wiring rule may be extracted so that the shield lines associated with the signal line can be determined.

Further, the shield line processing unit 61 may determine all of the extracted shield lines as the shield lines to be corrected collectively. The shield line processing unit 61 displays the extracted shield lines as correction candidates on the display unit 4. The operator refers to the candidate shield lines displayed on the display unit 4, and selects via the input unit the shield lines to be corrected collectively.

Then, in step S43, the shield line processing unit 61 corrects the placement of the thus selected shield lines in accordance with the changed wiring rule.

Here, it is preferable to make provisions so that the signal line associated with the shield lines to be corrected can be determined by selecting the shield lines. For this purpose, the association information defining the correspondence between the signal line and the shield lines, stored in the association information storage unit 31, is associated in both directions. By creating the association information so that it can be referenced in both directions, the placement data of the signal line that needs correcting in accordance with the corrected shield lines can be easily identified when determining the configuration of the corrected shield lines.

Figure 24:
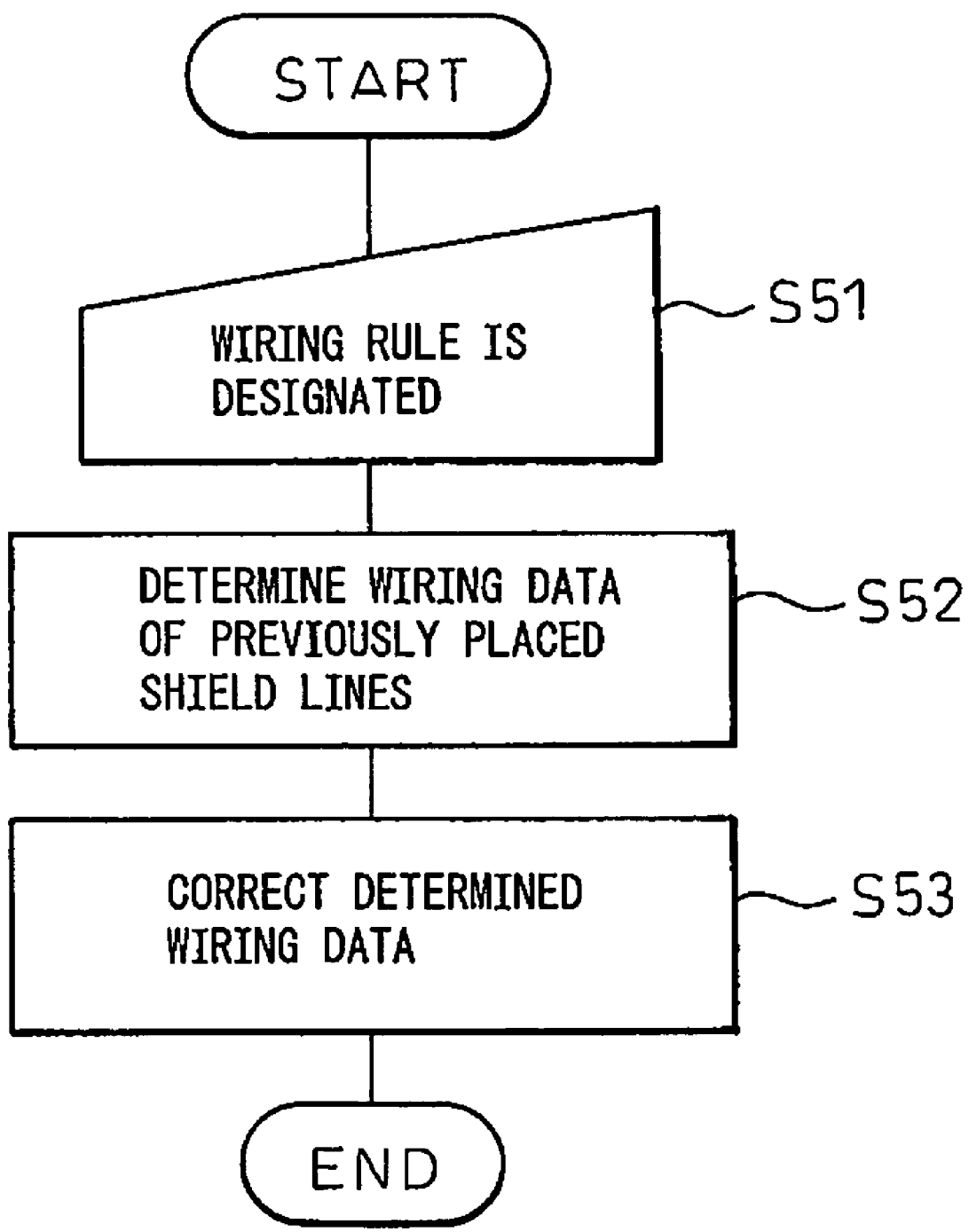
FIG. 24 is a flowchart showing a second example of a method for correcting a plurality of shield lines in a collective manner to match the changed design rule.

FIG. 24 is a flowchart showing the processing in a second example of the method for collectively correcting the plurality of shield lines when the shield line design rule is changed.

In step S51, the operator enters, into the computing unit 2, instruction information designating from among the wiring rules stored in the wiring rule data storage unit 32 a first wiring rule applied to the placement of the plurality of shield lines for which the design rule is changed and instruction information designating a second wiring rule that conforms to the new design rule.

In step S52, the shield line processing unit 61 shown in FIG. 3 determines the shield lines placed in accordance with the first wiring rule. In this case, instruction information designating the wiring rule to which the shield lines should conform, may be included in advance in the shield line wiring data, and the shield lines placed in accordance with the first wiring rule may be extracted by comparing the instruction information with the first wiring rule designating instruction information entered in step S51.

Alternatively, instruction information designating the wiring rule to which the shield lines should conform, may be included in the wiring data concerning the signal line which is simultaneously placed with this shield lines, by comparing this instruction information with the first instruction information entered in step S51, the signal line whose wiring data contains the first wiring rule designating instruction information may be extracted so that the shield lines associated with the signal line can be determined.

Further, the shield line processing unit 61 may determine all of the extracted shield lines as the shield lines to be corrected collectively, and the extracted shield lines may be displayed as candidates on the display unit 4, allowing the operator to select via the input unit the shield lines to be corrected collectively.

Then, in step S53, the shield line processing unit 61 corrects the placement of the thus selected shield lines in accordance with the second wiring rule.

The association information stored in the association information storage unit 31 is preferably associated in both directions so that the signal line can be identified from the shield lines thus determining the signal line associated with the shield lines to be corrected.

As described above, the semiconductor integrated circuit design program according to an embodiment can be recorded on a computer readable recording medium (for example, a flexible disk, a CD-ROM disk, a DVD disk, or a removable storage device), and the semiconductor integrated circuit design program recorded on such a recording medium may be read out by a reading unit and loaded into the design program storage unit 11 (implemented by a hard drive unit, a memory device, or the like) for execution by the design apparatus 1. That is, the prevent invention may include an embodiment as a computer readable recording medium, as will be described below.

According to the disclosed method, apparatus an program, in a semiconductor integrated circuit design that requires the placement of shield lines to be determined by manual operations, the efficiency of the semiconductor integrated circuit design work can be increased by greatly saving the labor required to determine the placement of the shield lines.

While the present invention has been described with reference to the preferred embodiments selected only for illustrative purposes, it is apparent to those skilled in the art that various modifications, omissions, and departures can be made to these embodiments without departing from the spirit and scope of the present invention. Further, it is to be understood that the terms used in the appended claims are not limited to the specific meanings used in the embodiments described in this specification.

What is claimed is:

1. A method of shield line placement for a semiconductor integrated circuit, comprising:
   accepting an input of a placement instruction of a signal line and storing first wiring data including coordinate information of the signal line and a first identifier in a memory;
   creating second wiring data of a shield line including coordinate information of the shield line and a second identifier by following a wiring rule that defines a mode of placement of the shield line in accordance with the mode of placement of the signal line, and storing the second wiring data in the memory;
   creating association information for associating the first and second identifiers;
   changing the wiring rule;
   specifying a pair of the first wiring data of the signal line inputted before the changing of the wiring rule and the second wiring data of the shield line associated with the signal line inputted before the changing of the wiring rule, by the association information, using a computer; and changing the second wiring data of the shield line of the pair specified, in accordance with the first wiring data of the signal line of the pair, by following the wiring rule after being changed.

2. The method of shield line placement as set forth in claim 1, wherein the shield line to be provided for the signal line is placed as the placement of the signal line is performed.

3. The method of shield line placement as set forth in claim 1, wherein first and second wiring rules are specified as the wiring rule,
the shield line placed in accordance with the first wiring rule is determined, and
the placement of the determined shield line is corrected in accordance with the second wiring rule.

4. A circuit design apparatus comprising:
an input unit which accepts an input of a placement instruction of a signal line and a change instruction for changing a wiring rule;
a wiring rule storage unit which stores a wiring rule that defines a mode of placement of the shield line in accordance with the mode of placement of the signal line;
a wiring data creating unit which creates a first identifier and first wiring data of a shield line, including coordinate information of the shield line, by following the wiring rule in accordance with the mode of placement of the signal line;
an association information storage unit which stores association information for associating a second identifier of second wiring data of the signal line with the first identifier of the first wiring data of the shield line placed for the signal line; and
a wiring data changing unit which specifies a pair of the second wiring data of the signal line inputted before the changing of the wiring rule and the first wiring data of the shield line associated with the signal line inputted before the changing of the wiring rule, by the association information and changes the first wiring data of the shield line of the specified pair, in accordance with the second wiring data of the signal line of the specified pair, by following the wiring rule after being changed.

5. The circuit design apparatus as set forth in claim 4, further comprising an association information creating unit which, in accordance with the second wiring data for the signal line, creates the association information for associating the second wiring data with first wiring data of the shield line corresponding to the signal line, and
wherein the association information created by the association information creating unit is stored in the association information storage unit.

6. The circuit design apparatus as set forth in claim 5, wherein the association information creating unit refers to information indicating whether the shield line is to be created for the signal line for which the second wiring data has been created, and creates the association information when it is determined that the shield line is to be created.

7. The circuit design apparatus as set forth in claim 4, wherein the shield wiring unit places the shield line for the signal line as the placement of the signal line is performed.

8. The circuit design apparatus as set forth in claim 4, further comprising input means for inputting information for specifying first and second wiring rules as the wiring rule, and
wherein the shield wiring unit corrects, in accordance with the second wiring rule, the wiring data of the shield line created in accordance with the first wiring rule.

9. A circuit design apparatus for executing a circuit design process, comprising:
input means for accepting an edit instruction for editing a wiring line placed on a circuit, and a change instruction for changing a wiring rule;
a display unit for displaying information concerning the edited circuit;
first storing means for storing a wiring rule;
second storing means for storing association information that indicates a correspondence between the wiring line and an additional wiring line placed for the wiring line;
wiring information generating means for determining, by referring to the wiring rule and the association information, the additional wiring line to be edited in corresponding relationship to the edited wiring line, and for generating wiring information of the thus determined additional wiring line; and
wiring information change means for specifying a pair of the wiring line inputted before the changes of the wiring rule and the additional wiring line associated with the wiring line inputted before the changes of the wiring rule, by the association information when the wiring rule is changed, and changing, by referring to the wiring rule after being changed, the wiring information of the additional wiring line of the specific pair in accordance with the wiring information of the wiring line of the specific pair.

10. The method of shield line placement as set forth in claim 1, further comprising:
changing the length of the signal line, after the mode of placement of the shield line is determined in accordance with the mode of placement of the signal line, and
changing the length of the shield line that is associated with the signal line by the association information, in response to the changing of the length of the signal line.

11. The circuit design apparatus as set forth in claim 4, wherein the input unit accepts a change instruction of the length of the signal line, after the mode of placement of the shield line is determined in accordance with the mode of placement of the signal line, and
wherein the shield wiring unit changes the length of the shield line that is associated with the signal line by the association information, in response to the change of the length of the signal line.

12. The circuit design apparatus as set forth in claim 9, wherein the input means accepts a change instruction of the length of the wiring line, after the wiring information generating means generates wiring information of the additional wiring line, and
wherein the wiring information change means changes the wiring information of the additional wiring line so as to change the length of the additional wiring line, in response to the change of the length of the wiring line.

* * * * *